(12) United States Patent
Kim et al.

(10) Patent No.: US 12,517,088 B2
(45) Date of Patent: Jan. 6, 2026

(54) METHOD FOR SELECTING MATERIAL FOR ORGANIC LIGHT-EMITTING DEVICE

(71) Applicant: LG CHEM, LTD., Seoul (KR)

(72) Inventors: Jihye Kim, Daejeon (KR); Sung Kil Hong, Daejeon (KR); Yeon Hwan Kim, Daejeon (KR); Daegyeon Kwon, Daejeon (KR); Heesung Ahn, Daejeon (KR)

(73) Assignee: LG CHEM, LTD., Seoul (KR)

( * ) Notice: Subject to any disclaimer, the term of this patent is extended or adjusted under 35 U.S.C. 154(b) by 1013 days.

(21) Appl. No.: 17/442,259

(22) PCT Filed: May 15, 2020

(86) PCT No.: PCT/KR2020/006407
§ 371 (c)(1),
(2) Date: Sep. 23, 2021

(87) PCT Pub. No.: WO2020/231213
PCT Pub. Date: Nov. 19, 2020

(65) Prior Publication Data
US 2022/0170883 A1    Jun. 2, 2022

(30) Foreign Application Priority Data
May 15, 2019    (KR) .................. 10-2019-0057179

(51) Int. Cl.
*G01N 27/48*    (2006.01)
*C09K 11/06*    (2006.01)
(Continued)

(52) U.S. Cl.
CPC .............. *G01N 27/48* (2013.01); *C09K 11/06* (2013.01); *H10K 50/11* (2023.02); *B07C 5/344* (2013.01);
(Continued)

(58) Field of Classification Search
None
See application file for complete search history.

(56) References Cited

U.S. PATENT DOCUMENTS

| | | | | |
|---|---|---|---|---|
| 2006/0051563 A1* | 3/2006 | Okumoto | ............. | H10K 50/155 428/917 |
| 2006/0257685 A1* | 11/2006 | Thompson | ............. | H10K 85/30 313/506 |

(Continued)

FOREIGN PATENT DOCUMENTS

| CN | 1674743 A | 9/2005 |
|---|---|---|
| CN | 101090887 A | 12/2007 |

(Continued)

OTHER PUBLICATIONS

Aydin, Hasan—"Interface Properties of Modified Indium Tin Oxide Based Organic Light Emitting Diodes with Functional Aromatic Molecules"; A Thesis submitted to the Graduate School of Engineering and Sciences of Izmir Institute of Technology . . . (2011). (Year: 2011).*

(Continued)

*Primary Examiner* — Arleen M Vazquez
*Assistant Examiner* — Leonard S Liang
(74) *Attorney, Agent, or Firm* — Bryan Cave Leighton Paisner LLP

(57) ABSTRACT

Provided is a method for selecting a material for an organic light-emitting device, the method including comparing the reversibilities (electrical stability in the (+) radical and (−) radical states of a material) of the material using cyclic voltammetry (CV).

3 Claims, 31 Drawing Sheets

(51) Int. Cl.
| | |
|---|---|
| *H10K 50/11* | (2023.01) |
| *B07C 5/344* | (2006.01) |
| *C07D 209/86* | (2006.01) |
| *C07D 403/14* | (2006.01) |
| *C07D 405/04* | (2006.01) |
| *C07F 7/08* | (2006.01) |
| *C07F 9/53* | (2006.01) |
| *C07F 15/00* | (2006.01) |
| *H10K 50/12* | (2023.01) |
| *H10K 71/00* | (2023.01) |
| *H10K 85/40* | (2023.01) |
| *H10K 85/60* | (2023.01) |
| *H10K 101/30* | (2023.01) |

(52) U.S. Cl.
CPC ......... *C07D 209/86* (2013.01); *C07D 403/14* (2013.01); *C07D 405/04* (2013.01); *C07F 7/081* (2013.01); *C07F 9/5325* (2013.01); *C07F 15/0033* (2013.01); *H10K 50/12* (2023.02); *H10K 71/00* (2023.02); *H10K 85/40* (2023.02); *H10K 85/636* (2023.02); *H10K 85/649* (2023.02); *H10K 85/658* (2023.02); *H10K 2101/30* (2023.02)

(56) References Cited

U.S. PATENT DOCUMENTS

| | | | | |
|---|---|---|---|---|
| 2007/0049760 A1* | 3/2007 | Kawakami | ............ | C09K 11/06 548/440 |
| 2007/0066848 A1 | 3/2007 | Akashi et al. | | |
| 2007/0267969 A1* | 11/2007 | Nakashima | .......... | H10K 85/636 548/440 |
| 2008/0105568 A1* | 5/2008 | Wu | ........................ | C12Q 1/005 205/785.5 |
| 2009/0036622 A1 | 2/2009 | Marrocco et al. | | |
| 2009/0066222 A1* | 3/2009 | Akashi | ................ | H10K 85/631 564/305 |
| 2009/0134784 A1* | 5/2009 | Lin | ........................ | C09K 11/06 546/276.7 |
| 2009/0153034 A1* | 6/2009 | Lin | .................... | H10K 85/6572 548/428 |
| 2009/0278445 A1* | 11/2009 | Jen | ....................... | C08G 61/124 548/440 |
| 2010/0032316 A1* | 2/2010 | Wu | .................... | G01N 27/3273 204/406 |
| 2010/0252113 A1* | 10/2010 | Marks | .................... | H10K 30/30 257/E51.027 |
| 2010/0283047 A1* | 11/2010 | Facchetti | ............. | H10K 85/113 427/430.1 |
| 2010/0300899 A1* | 12/2010 | Levine | ............... | G01N 27/3277 205/792 |
| 2011/0069098 A1 | 3/2011 | Lee et al. | | |
| 2013/0140549 A1 | 6/2013 | Xia et al. | | |
| 2016/0103171 A1 | 4/2016 | Tsutsui et al. | | |
| 2017/0098776 A1 | 4/2017 | Nakashima et al. | | |
| 2017/0117350 A1 | 4/2017 | Jang et al. | | |
| 2017/0138884 A1* | 5/2017 | Lee | ........................ | G01N 27/48 |
| 2017/0153200 A1 | 6/2017 | Komoto | | |
| 2019/0006590 A1 | 1/2019 | Park et al. | | |
| 2019/0058144 A1 | 2/2019 | Lee et al. | | |
| 2020/0161557 A1* | 5/2020 | Shibuya | ............... | C07D 333/78 |

FOREIGN PATENT DOCUMENTS

| | | | |
|---|---|---|---|
| CN | 102928480 A | * | 2/2013 |
| JP | 6280346 | | 2/2018 |
| KR | 10-2001-0059194 | | 7/2001 |
| KR | 10-2007-0093061 | | 9/2007 |
| KR | 10-2007-0108381 | | 11/2007 |
| KR | 10-2011-0032245 | | 3/2011 |
| KR | 10-2013-0100194 | | 9/2013 |
| KR | 10-1347240 | | 1/2014 |
| KR | 10-2015-0107677 | | 9/2015 |
| KR | 10-2015-0136138 | | 12/2015 |
| KR | 10-2017-0036707 | | 4/2017 |
| KR | 10-1744248 | | 6/2017 |
| KR | 10-2019-0013105 | | 2/2019 |
| TW | 200523232 A | | 7/2005 |
| TW | 200614869 A | | 5/2006 |
| TW | 201609418 A | | 3/2016 |

OTHER PUBLICATIONS

Pluczyk, S., Vasylieva, M., Data, P. Using Cyclic Voltammetry, UV-Vis-NIR, and EPR Spectroelectrochemistry to Analyze Organic Compounds. J. Vis. Exp. (140), e56656, doi: 10.3791/56656 (2018). (Year: 2018).*

Machine Translation for CN102928480A (Year: 2013).*

Basic Theory and Test Methods of Electrochemistry, "Application of electrochemical testing in the field of organic optoelectronic functional materials," (Li Dong, Editor-in-Chief), ISBN: 978-7-5024-8374-6 (2019), pp. 82-84 (English Abstract provided).

Ding et al., "Convenient Electrochemical Method to Determine the Energy Level of Organic Electroluminescent Materials", Chinese Journal of Luminescence, vol. 24, No. 6, pp. 606-611 (2003) (English Abstract provided).

Lee et al., "Measurement of Physical Properties of Conducting Polymers," Polymer Science and Technology, 18 (5):488-495 (2007).

Shayani-Jam, H., "Electrochemical study of adsorption and electrooxidation of 4,4'-biphenol on the glassy carbon 2 electrode: determination of the orientation of adsorbed molecules," Monatshefte fur Chemie-Chemical Monthly, 150:183-192 (2019).

* cited by examiner

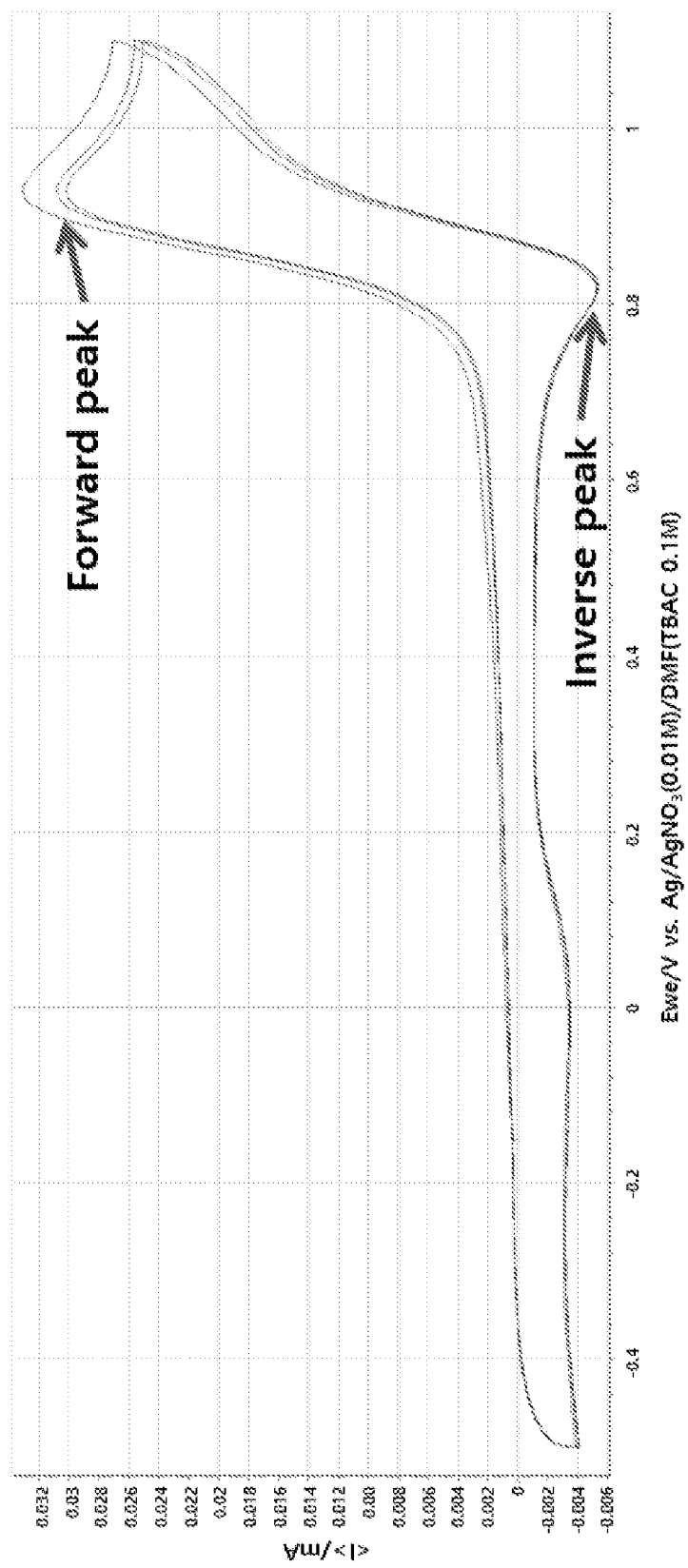
[FIG 1]

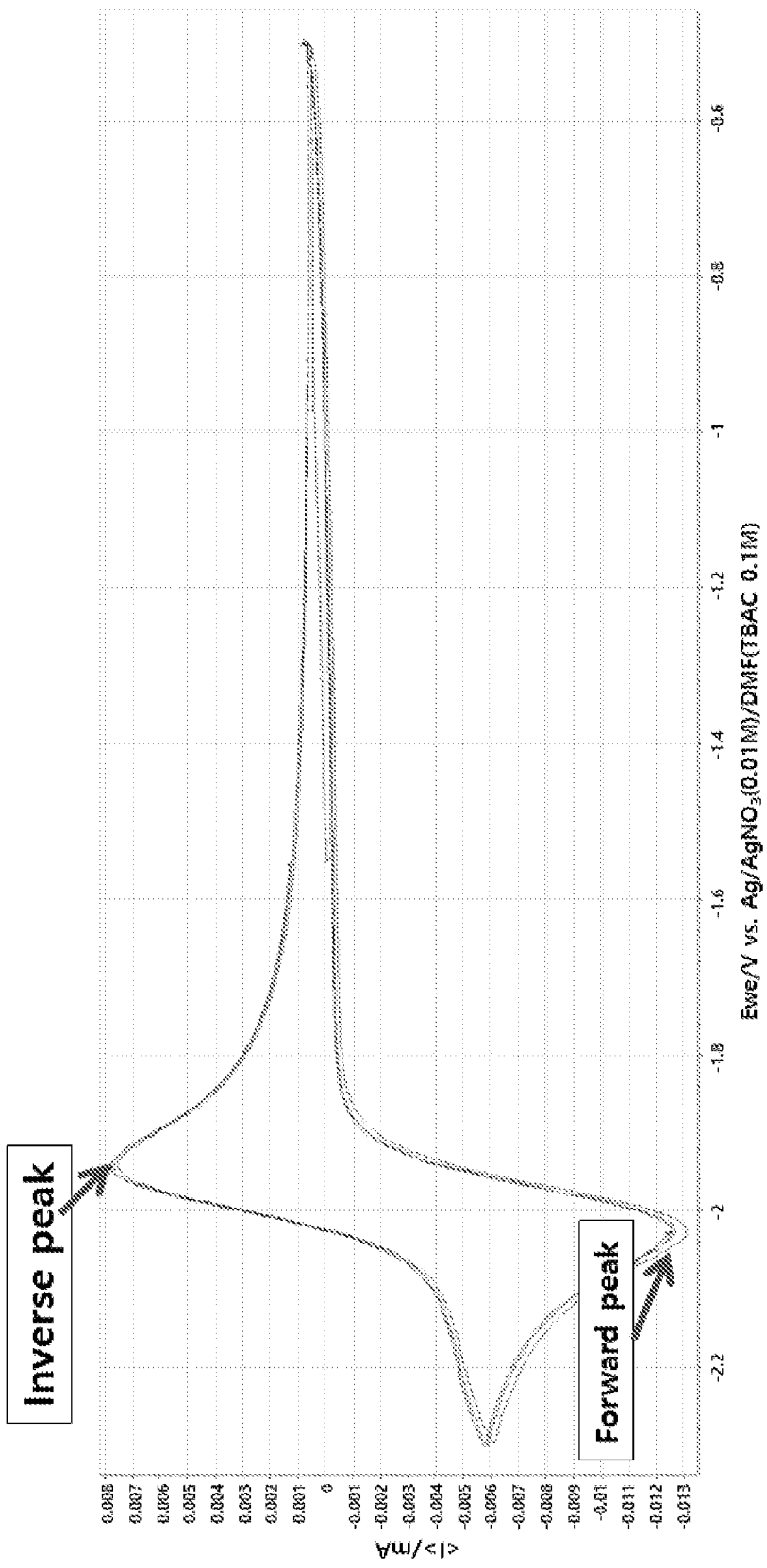

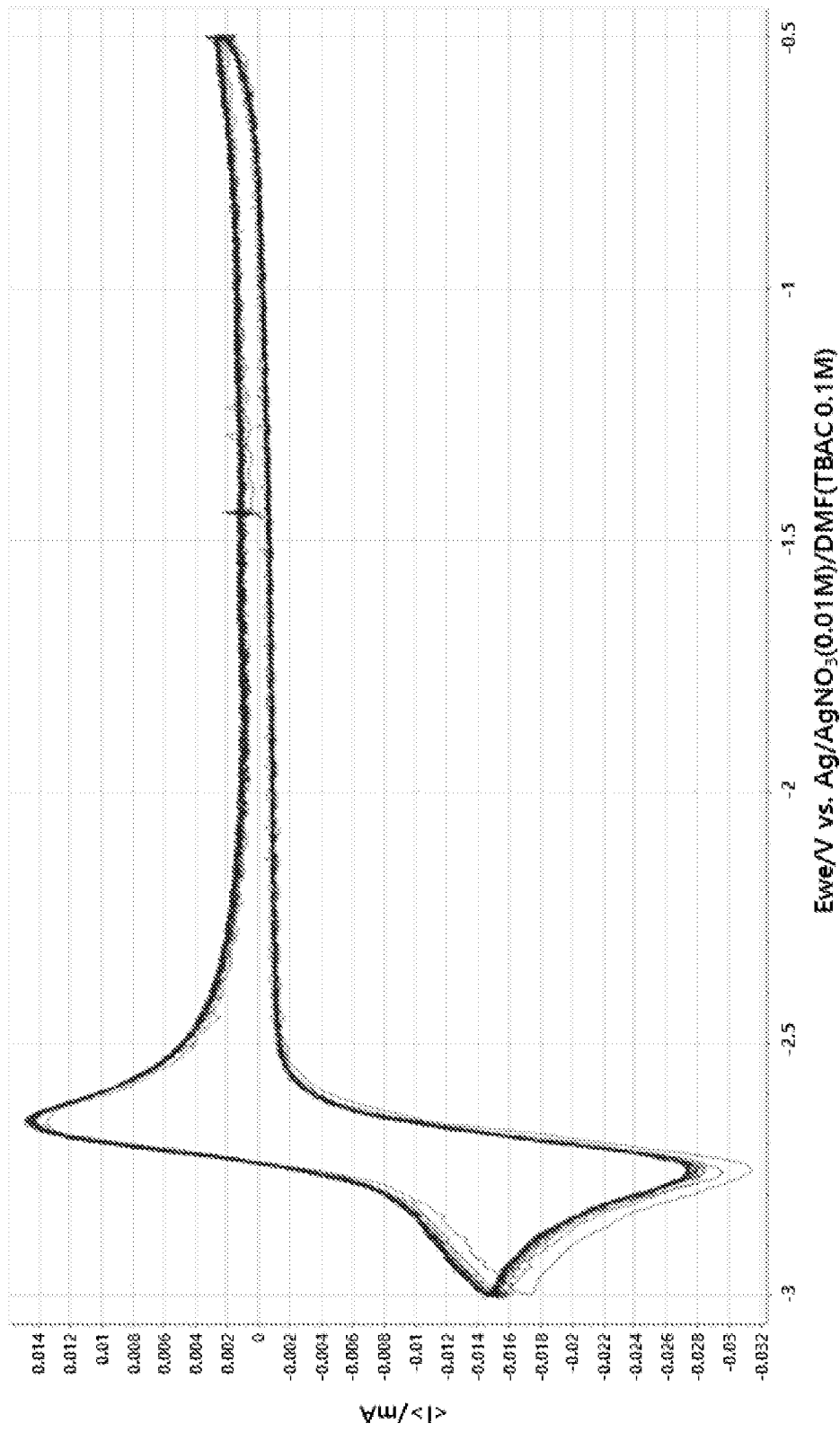
[FIG 3]

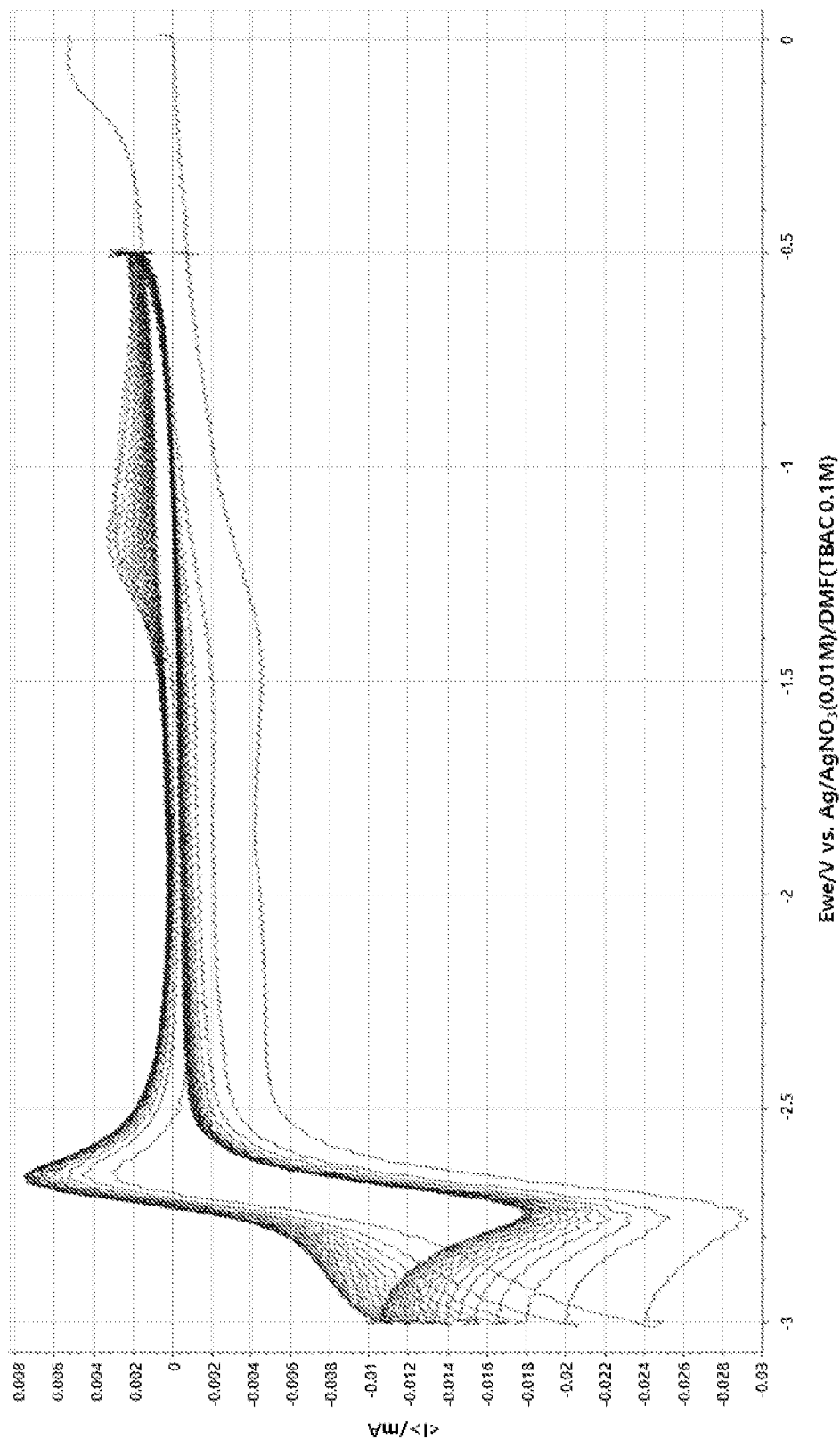
[FIG 4]

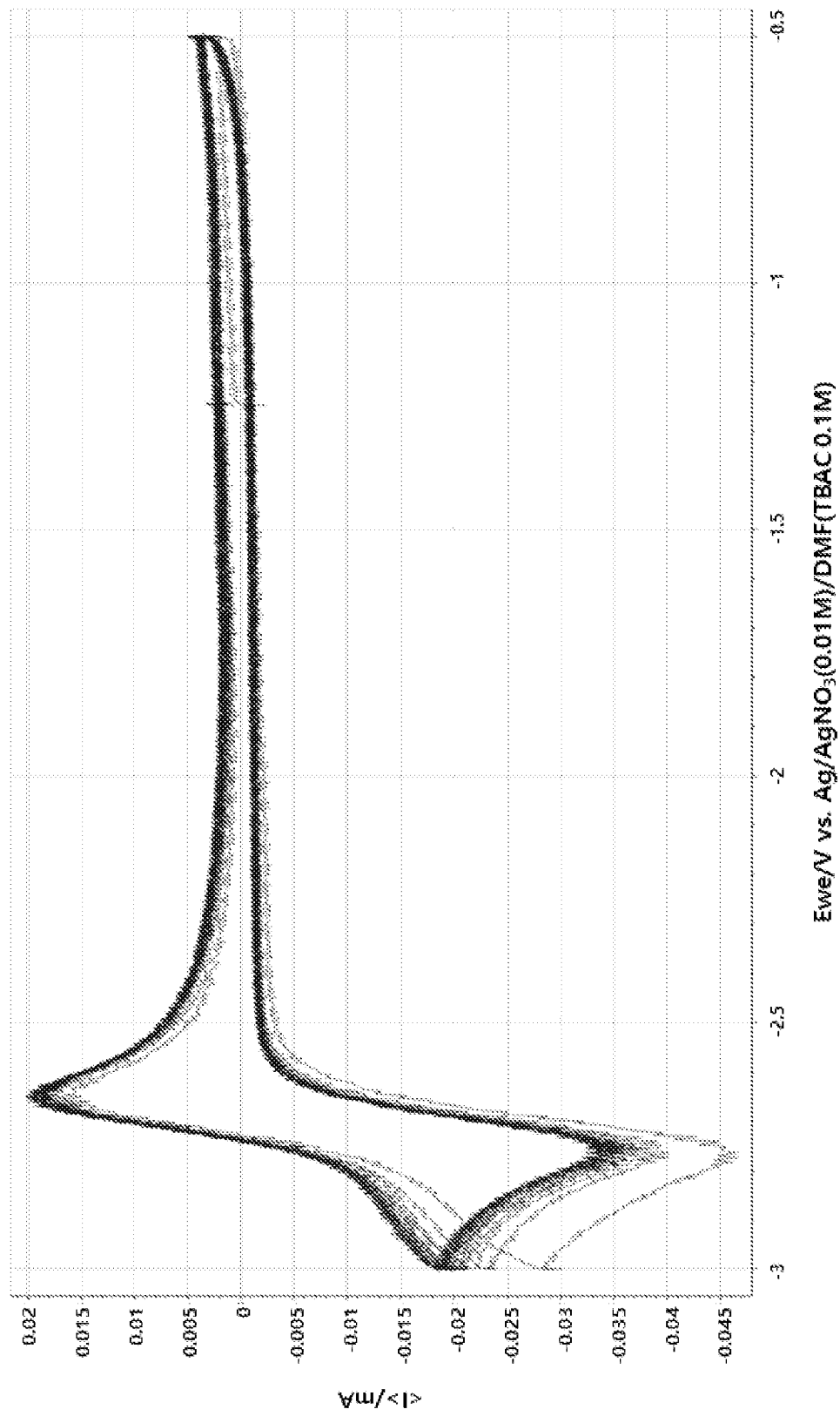
[FIG 5]

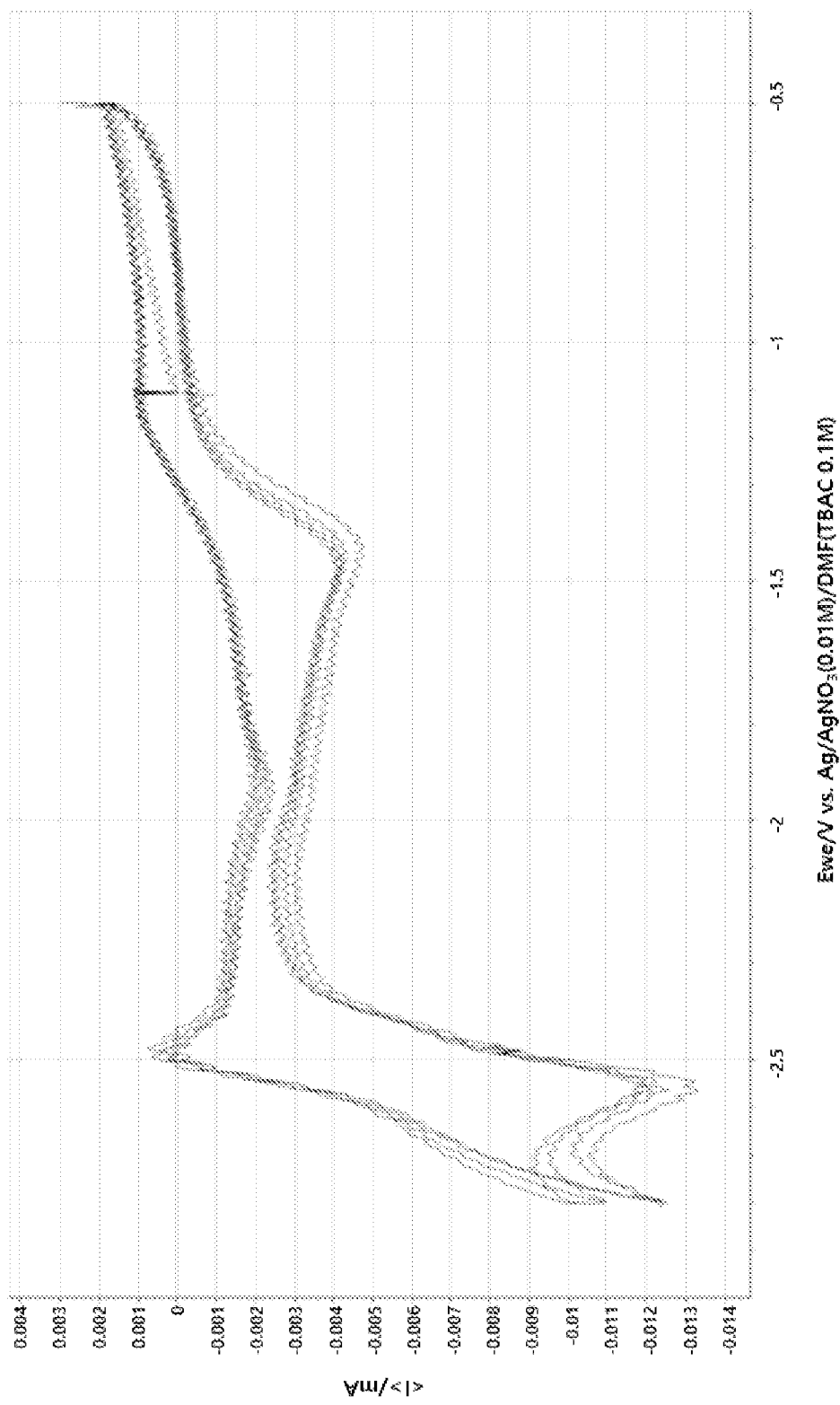
[FIG 6]

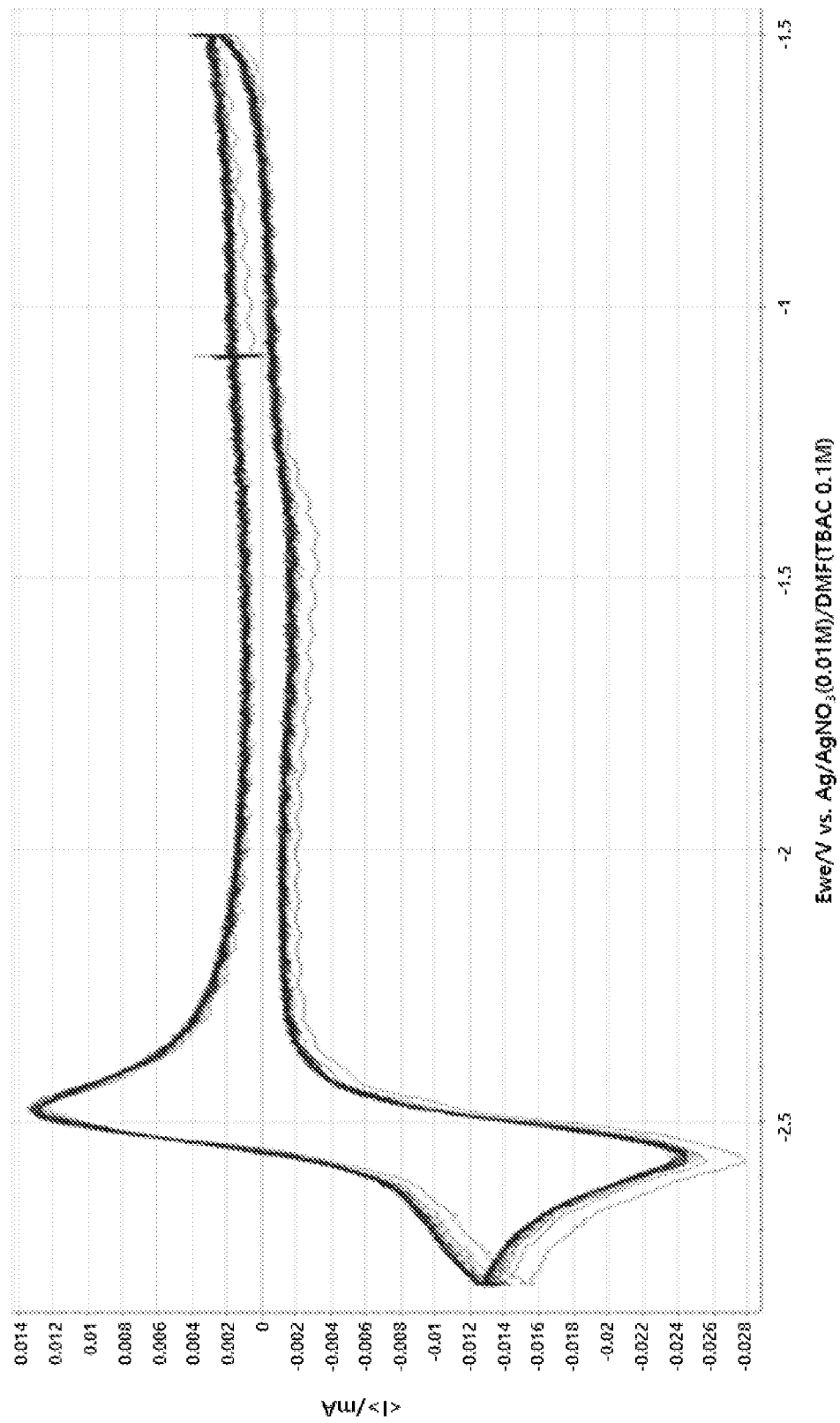
[FIG 7]

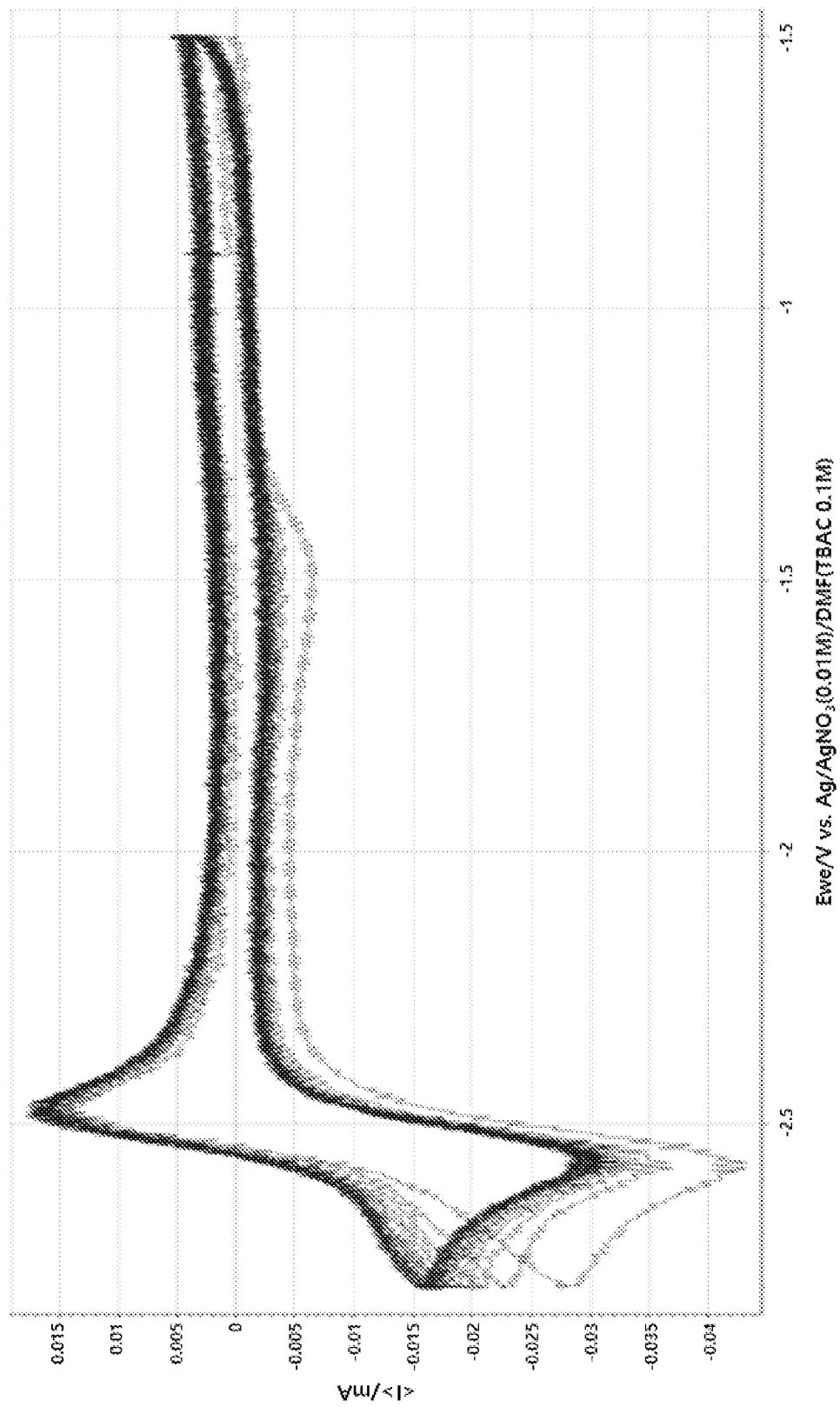

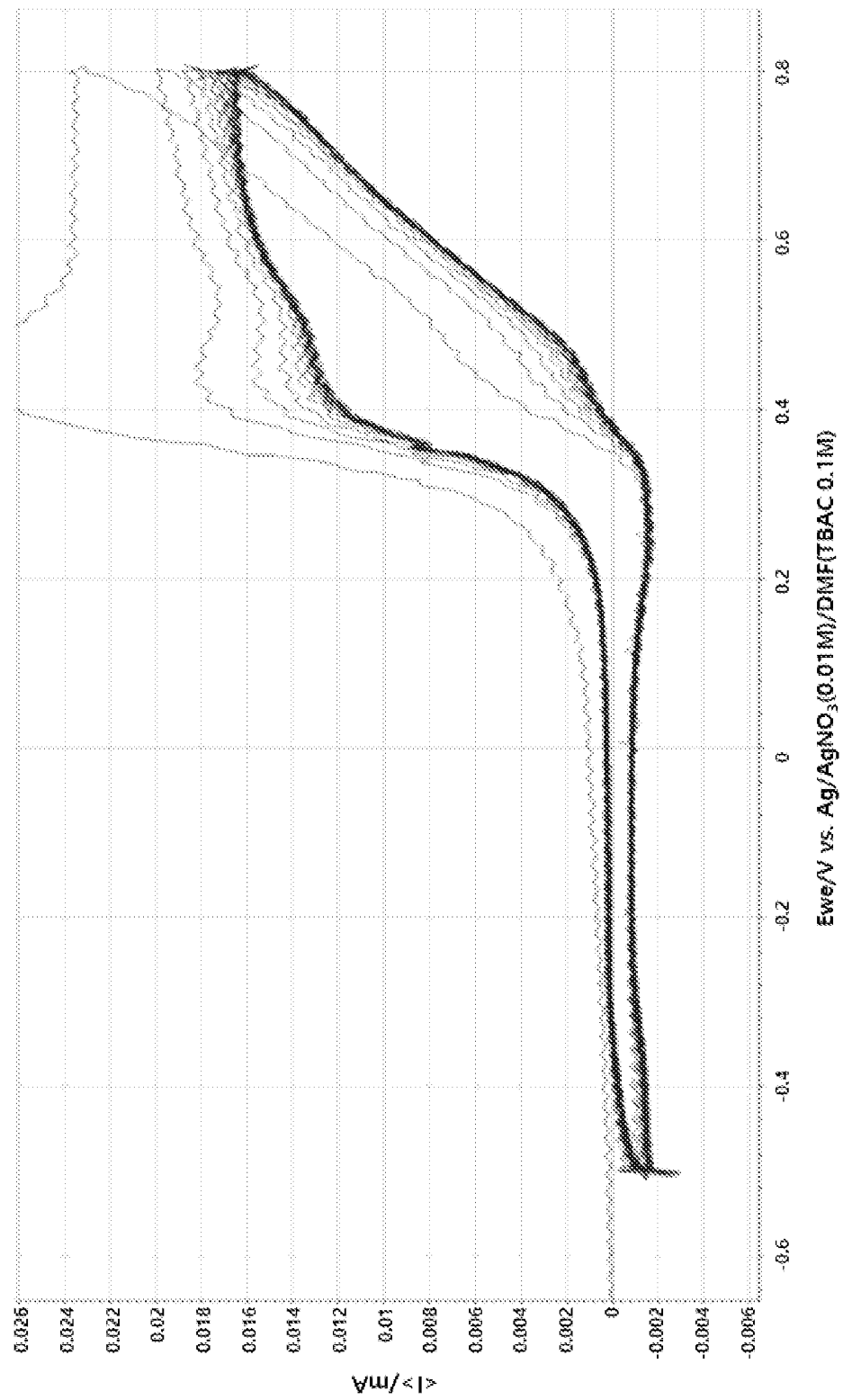
[FIG 9]

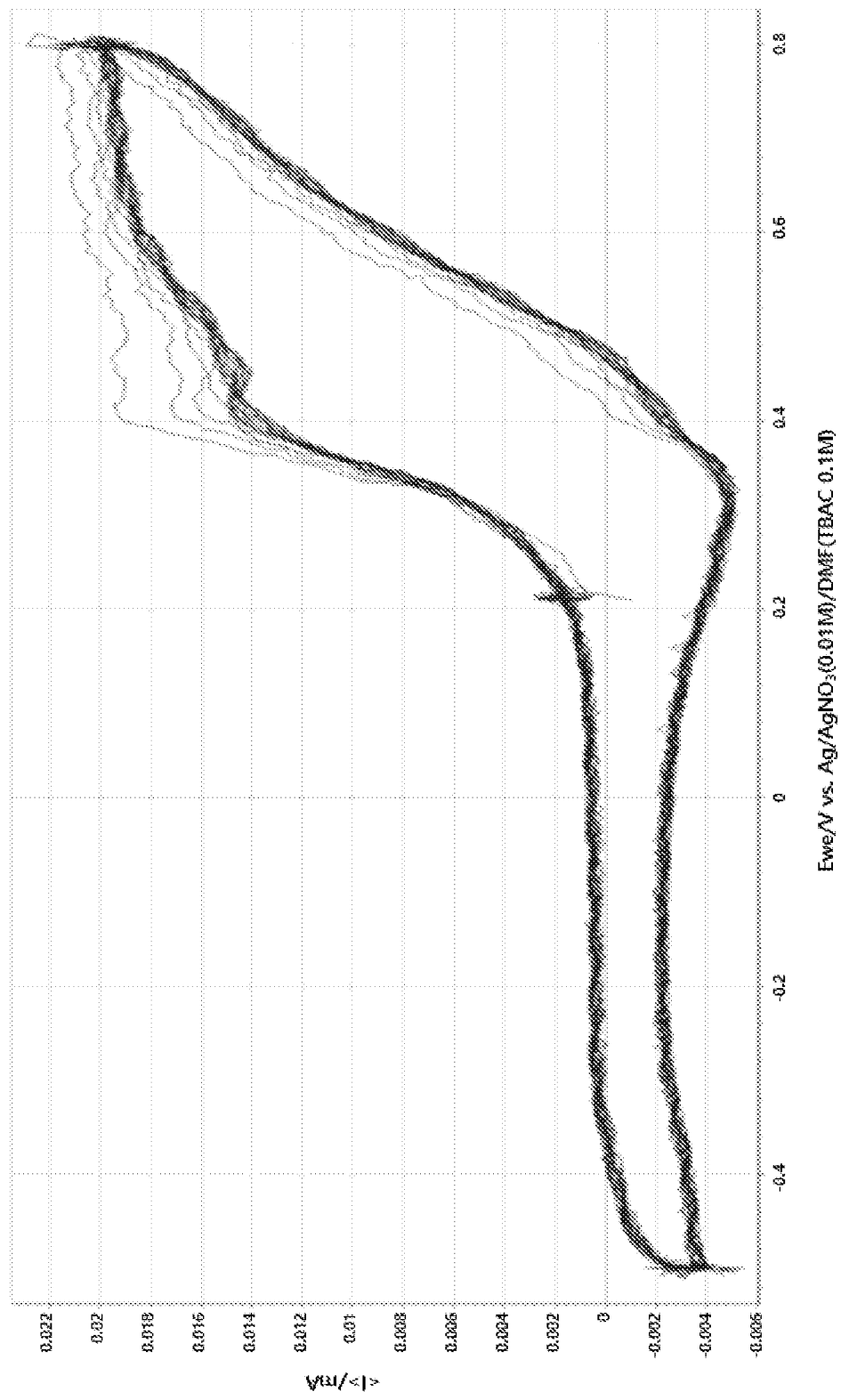
[FIG 10]

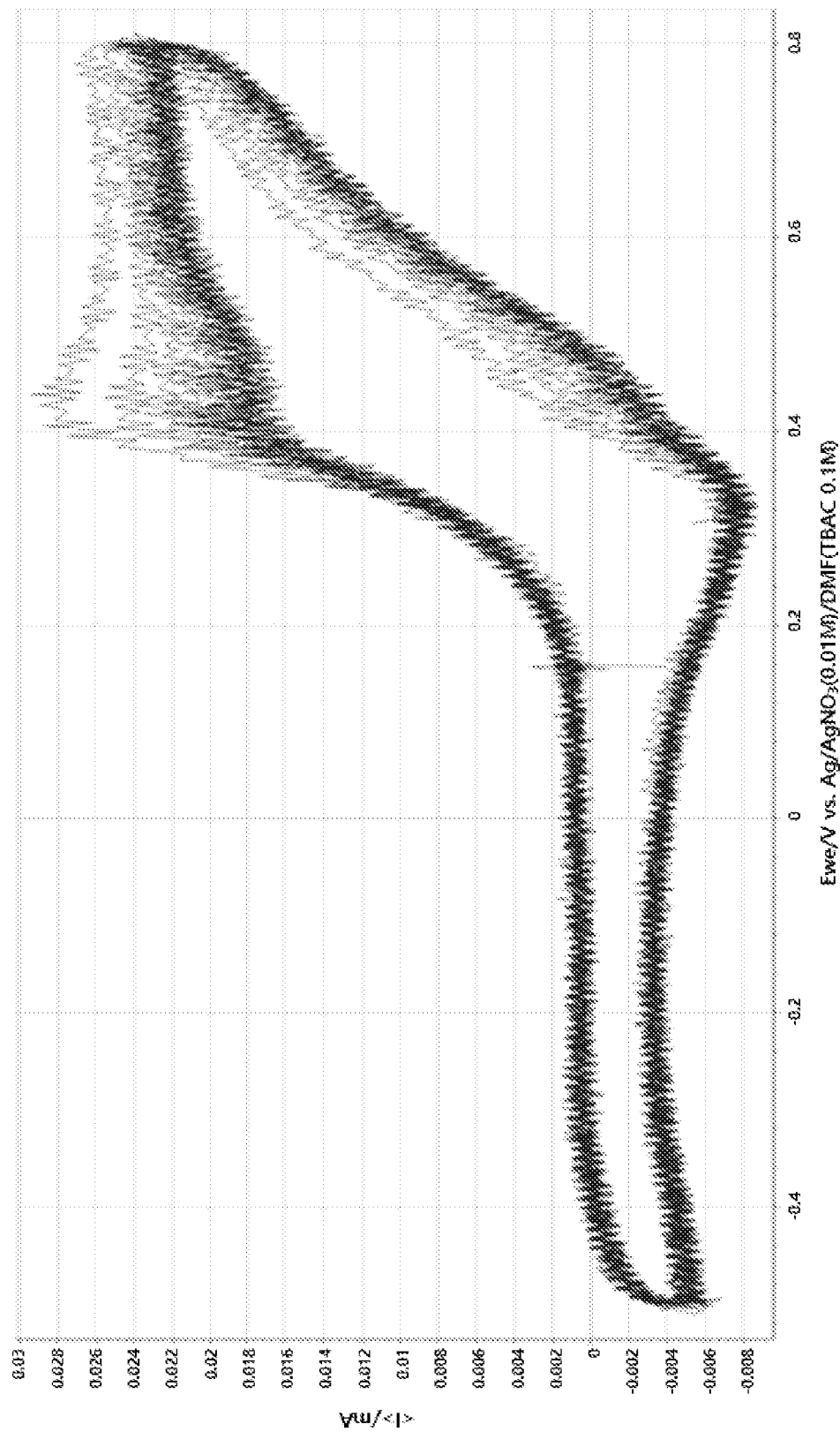
[FIG 11]

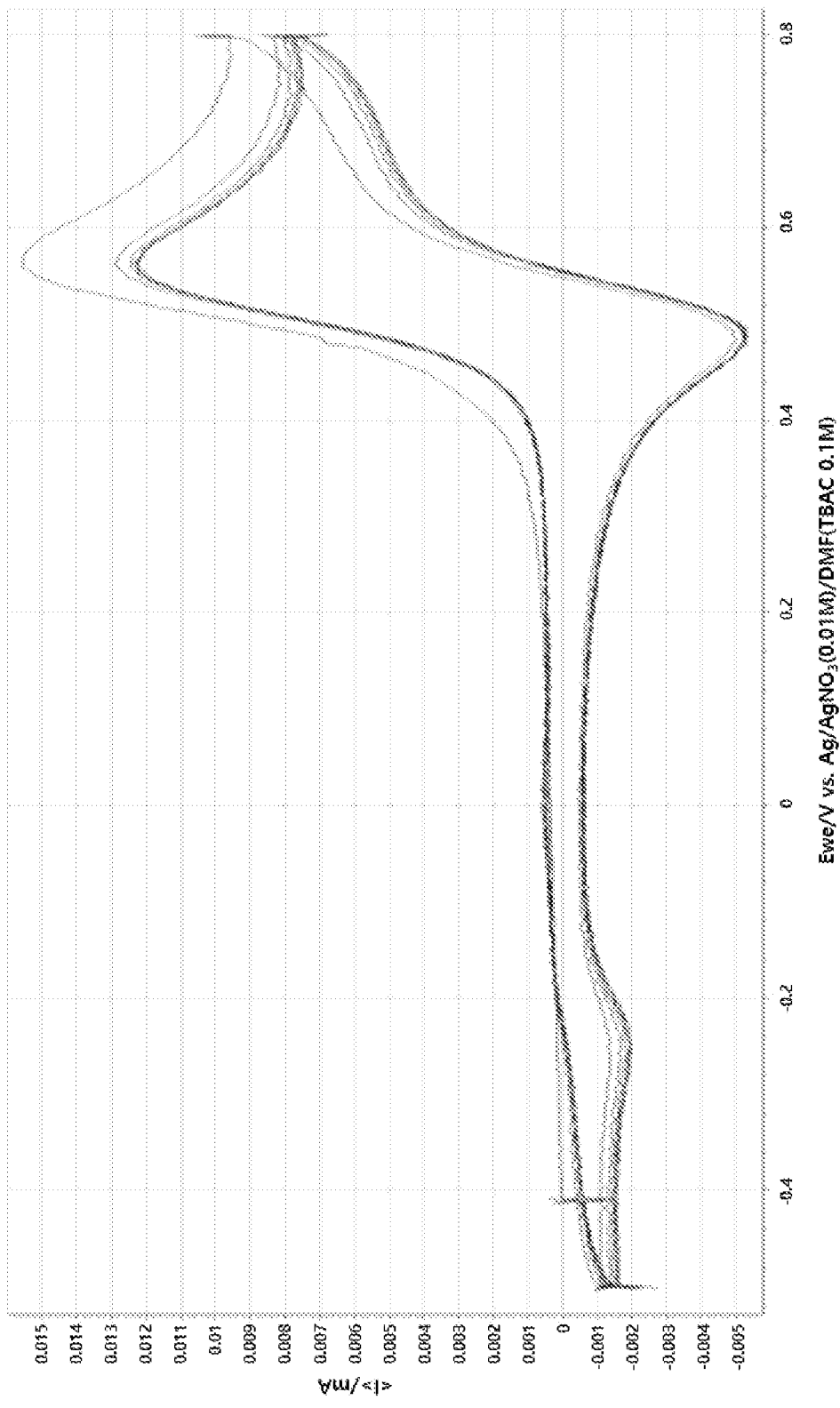
[FIG 12]

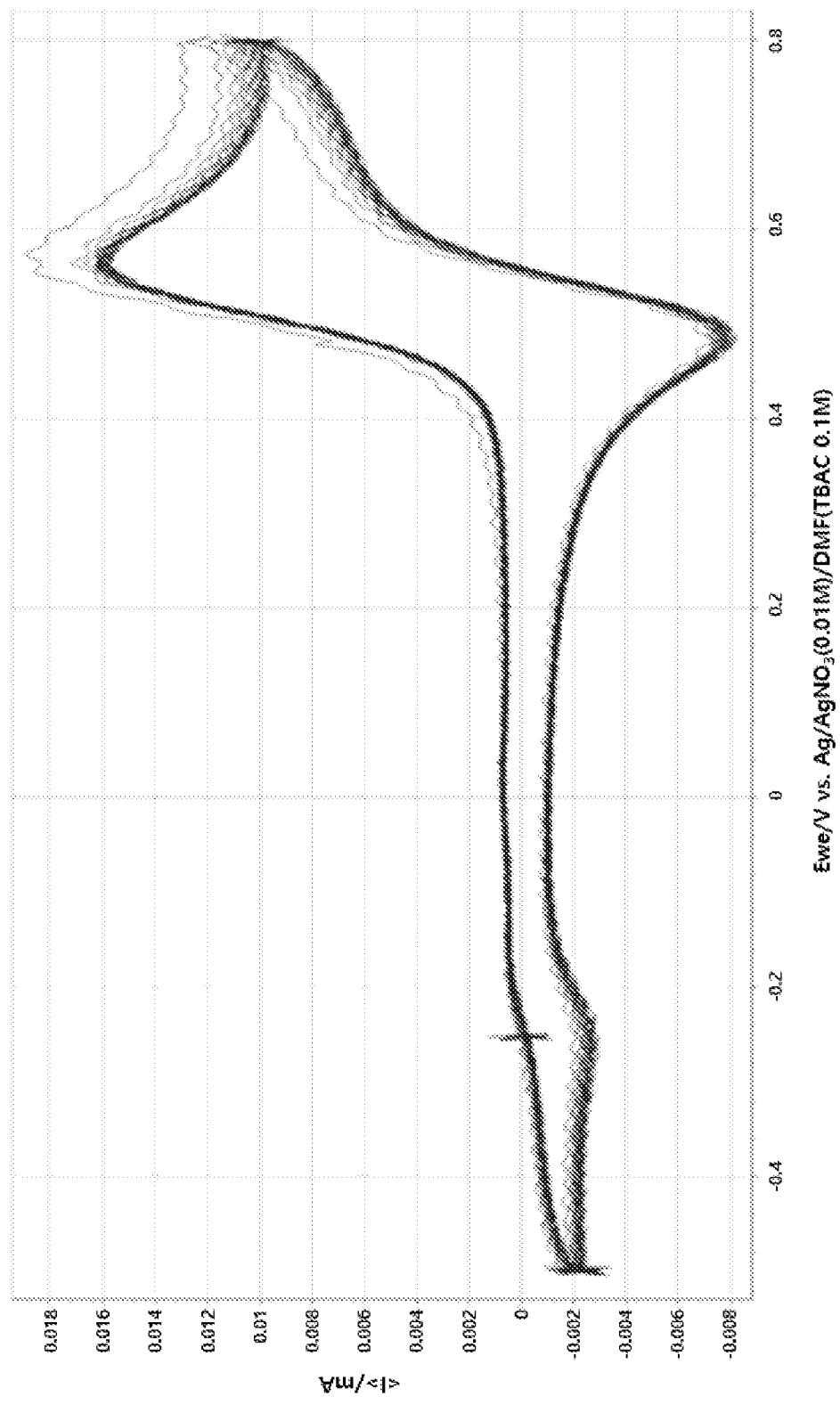
[FIG 13]

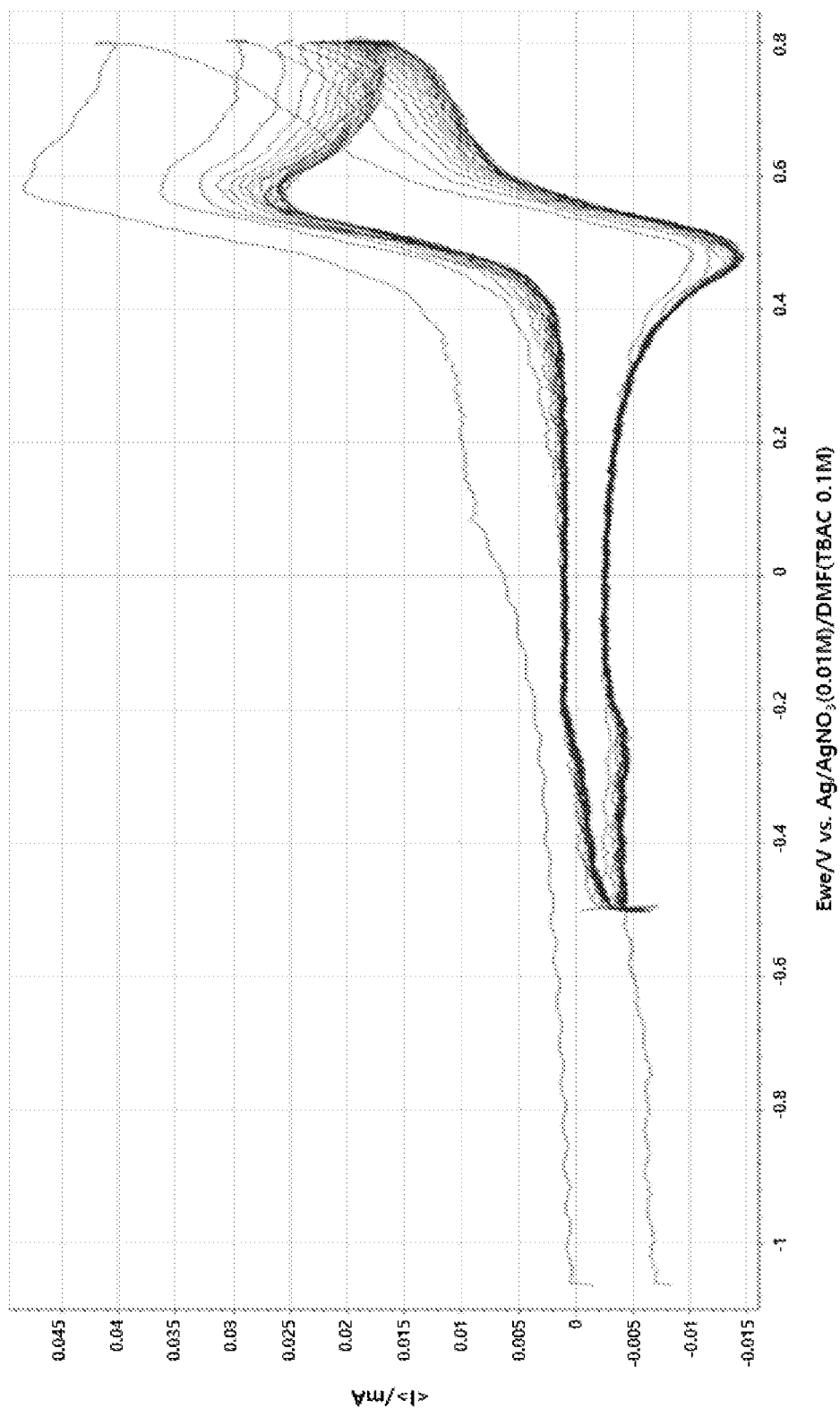
[FIG 14]

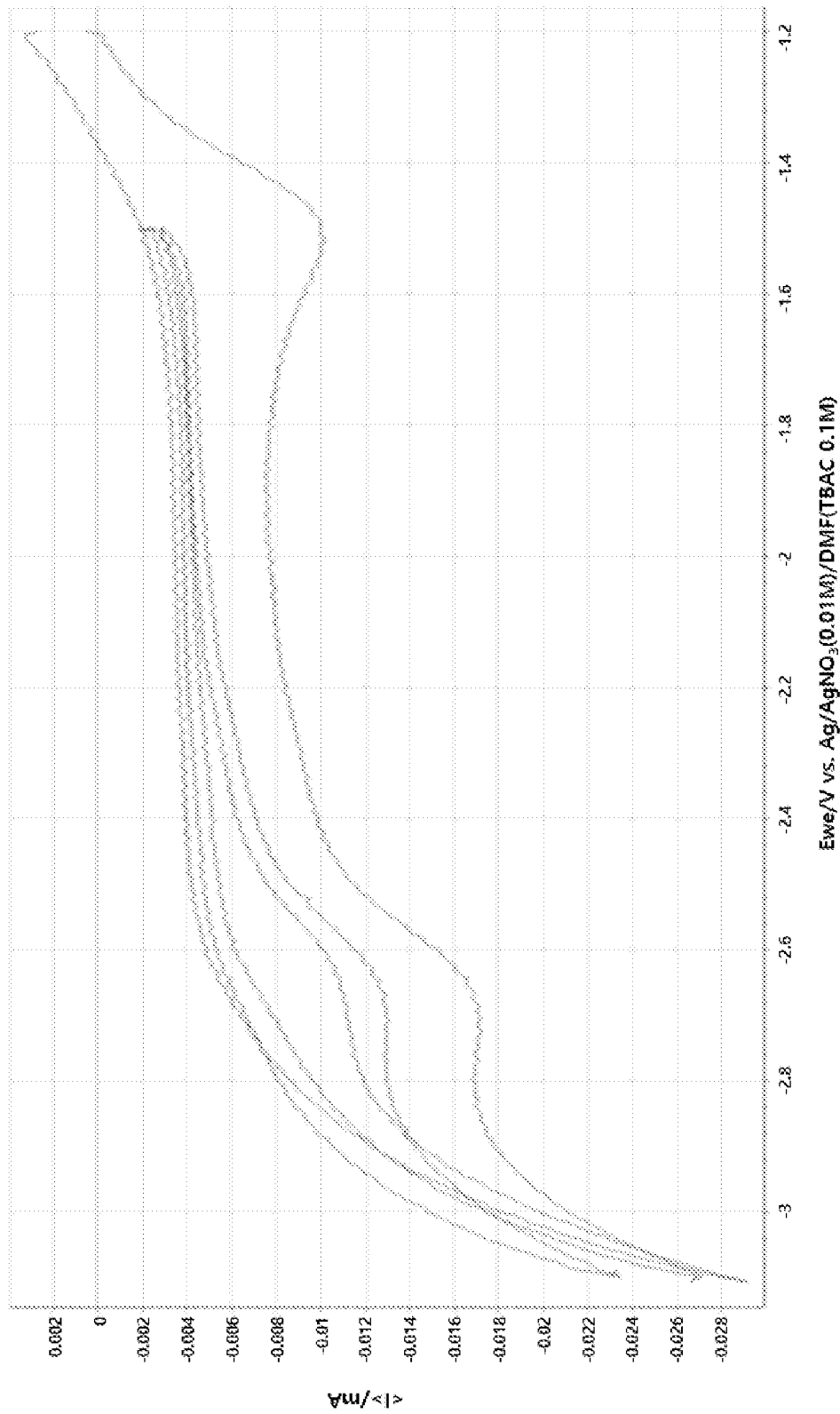
[FIG 15]

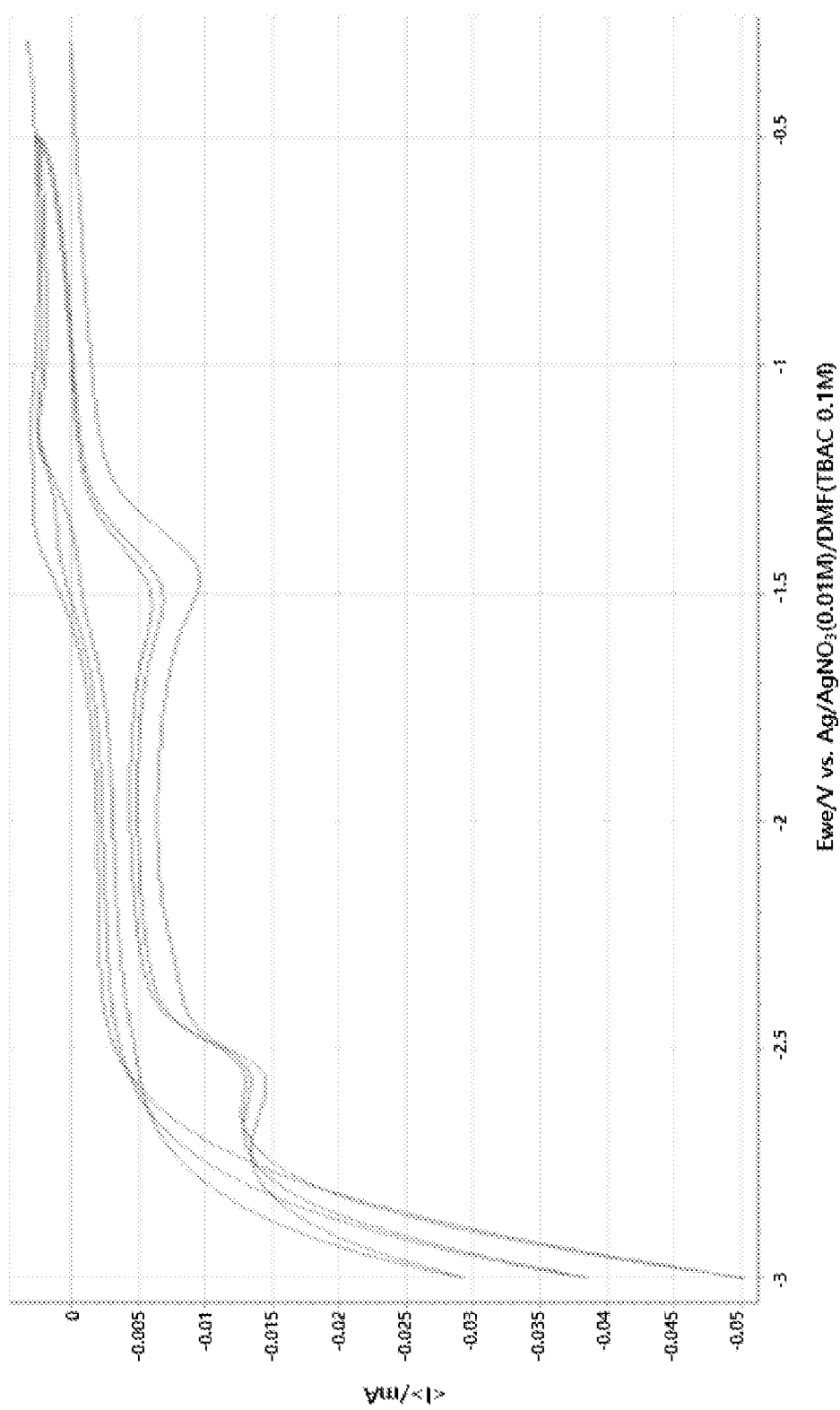
[FIG 16]

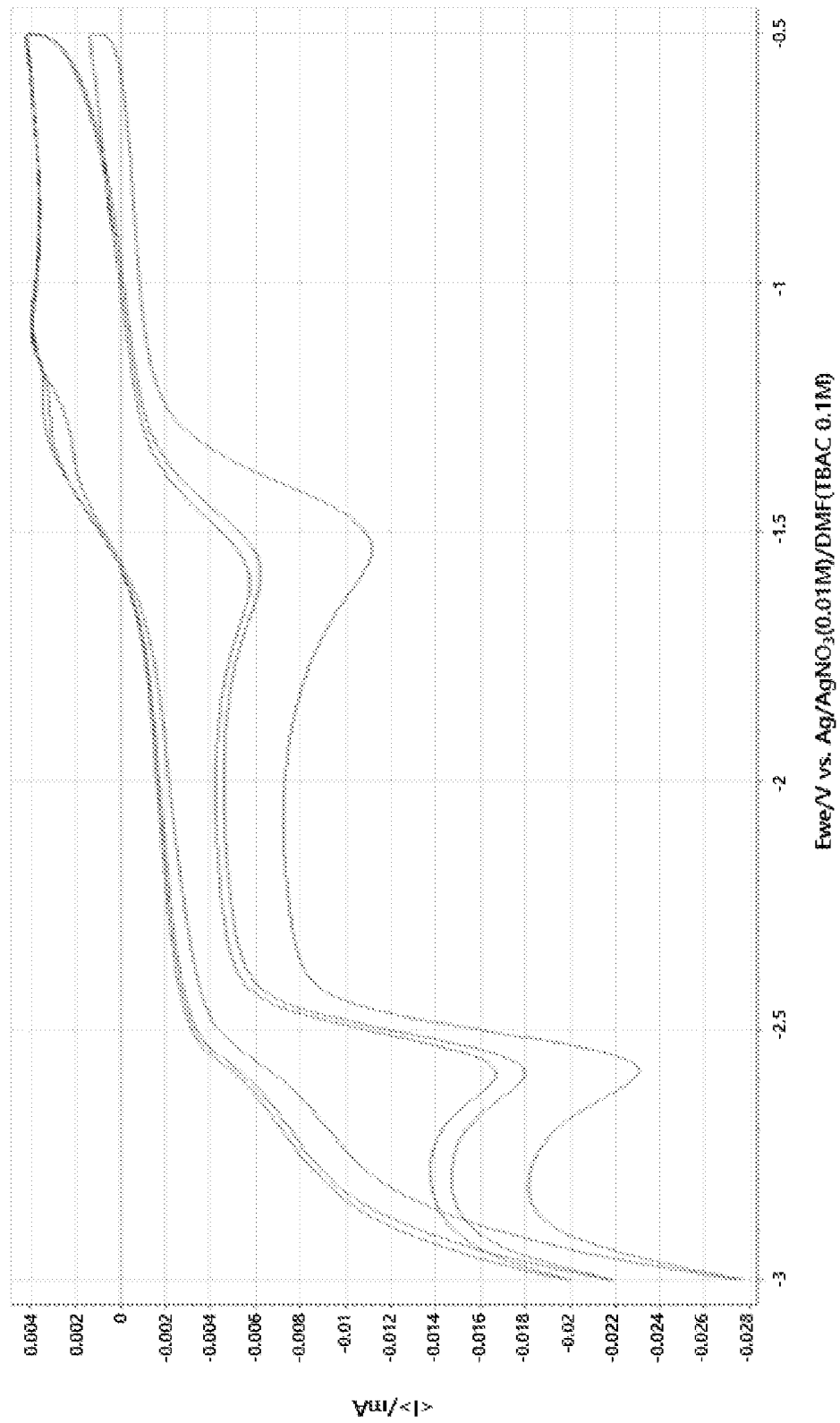
[FIG 17]

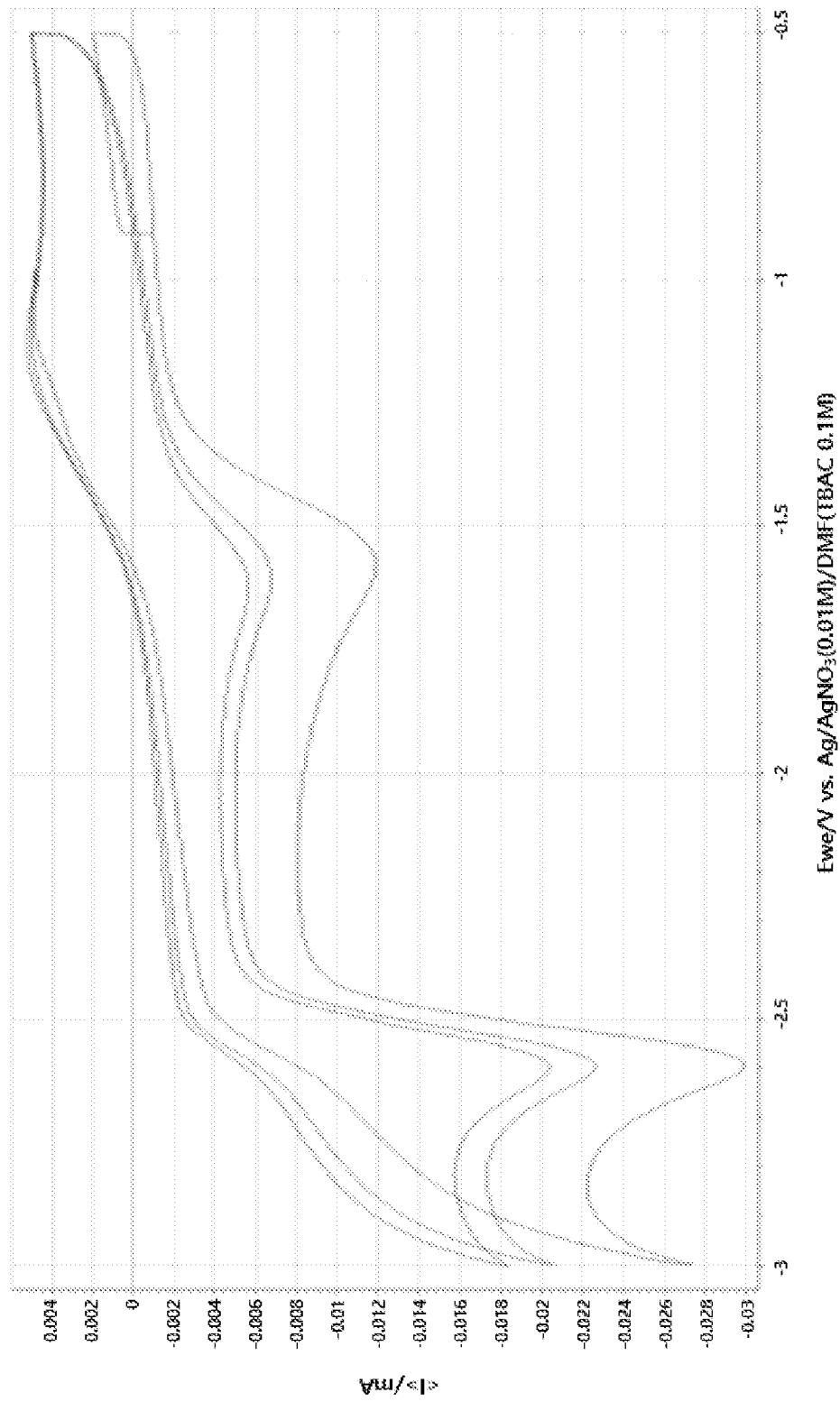
[FIG 18]

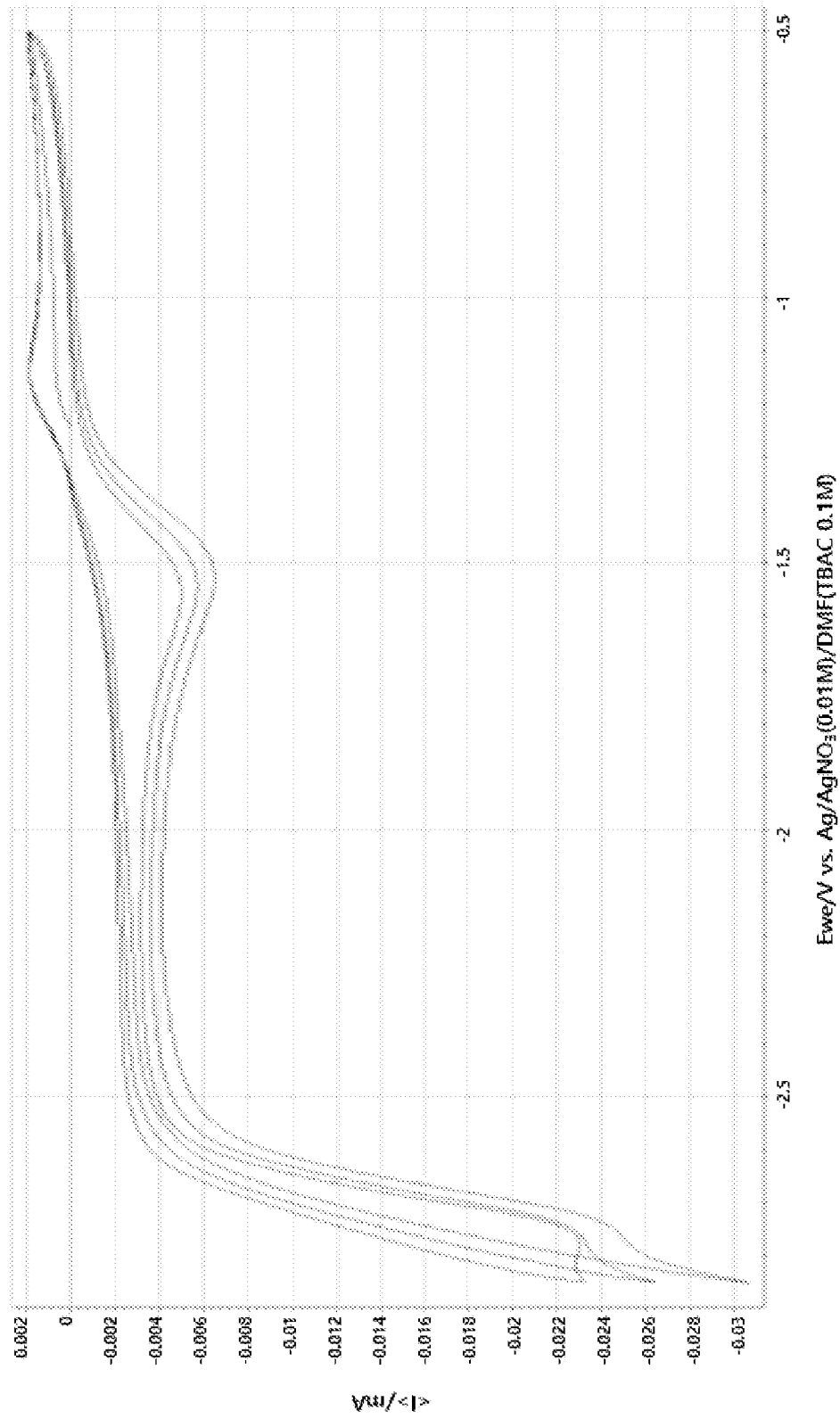
[FIG 19]

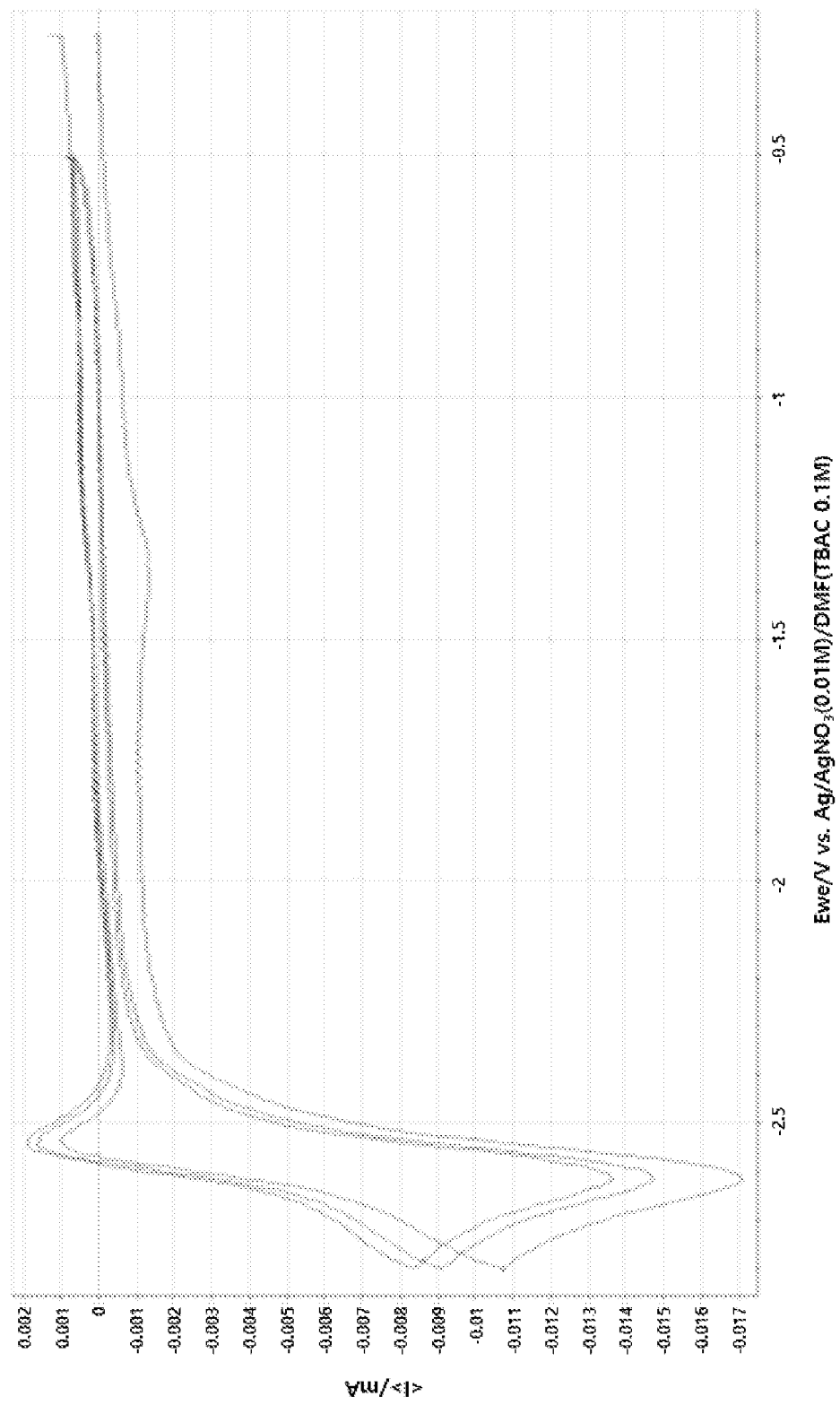
[FIG 20]

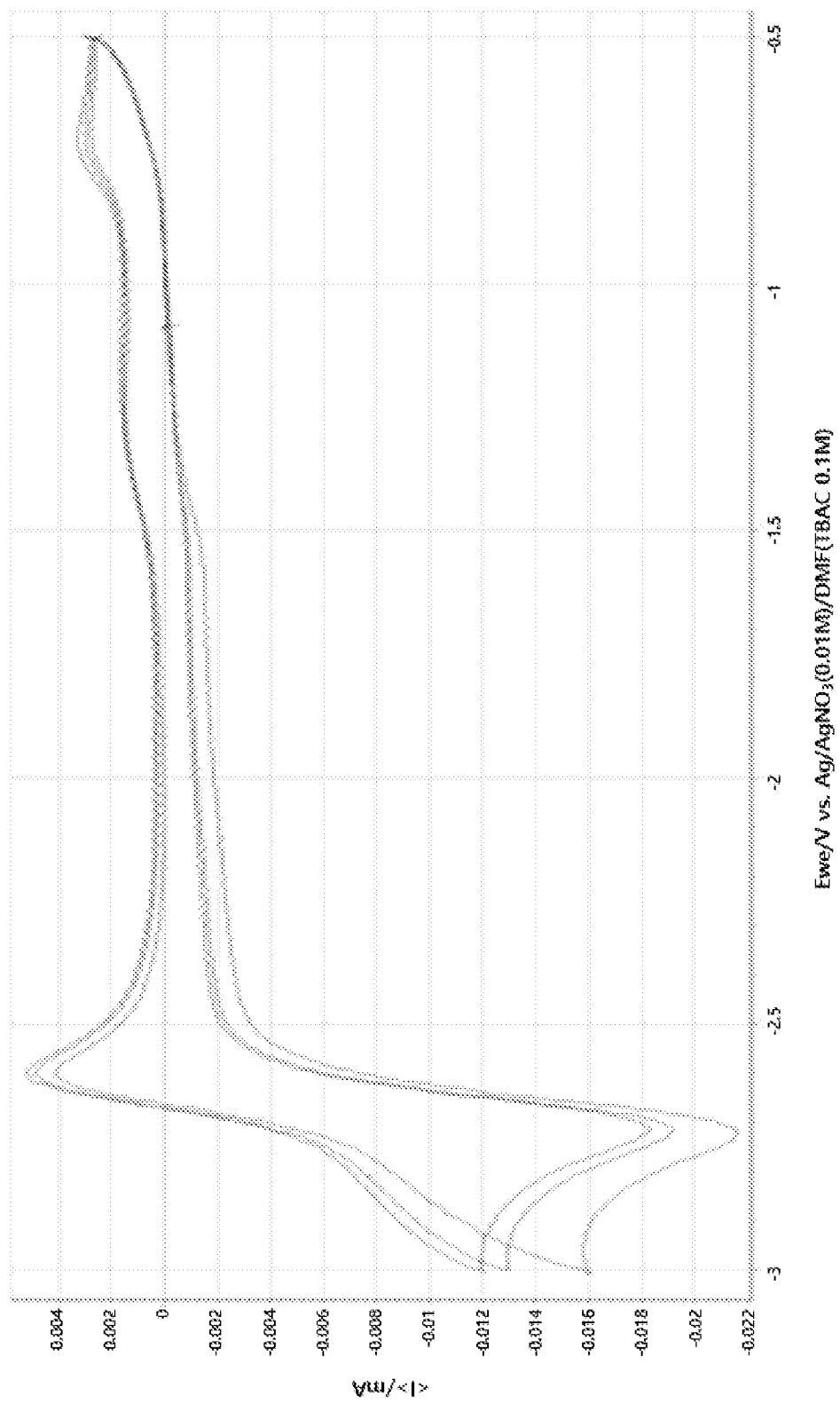
[FIG 21]

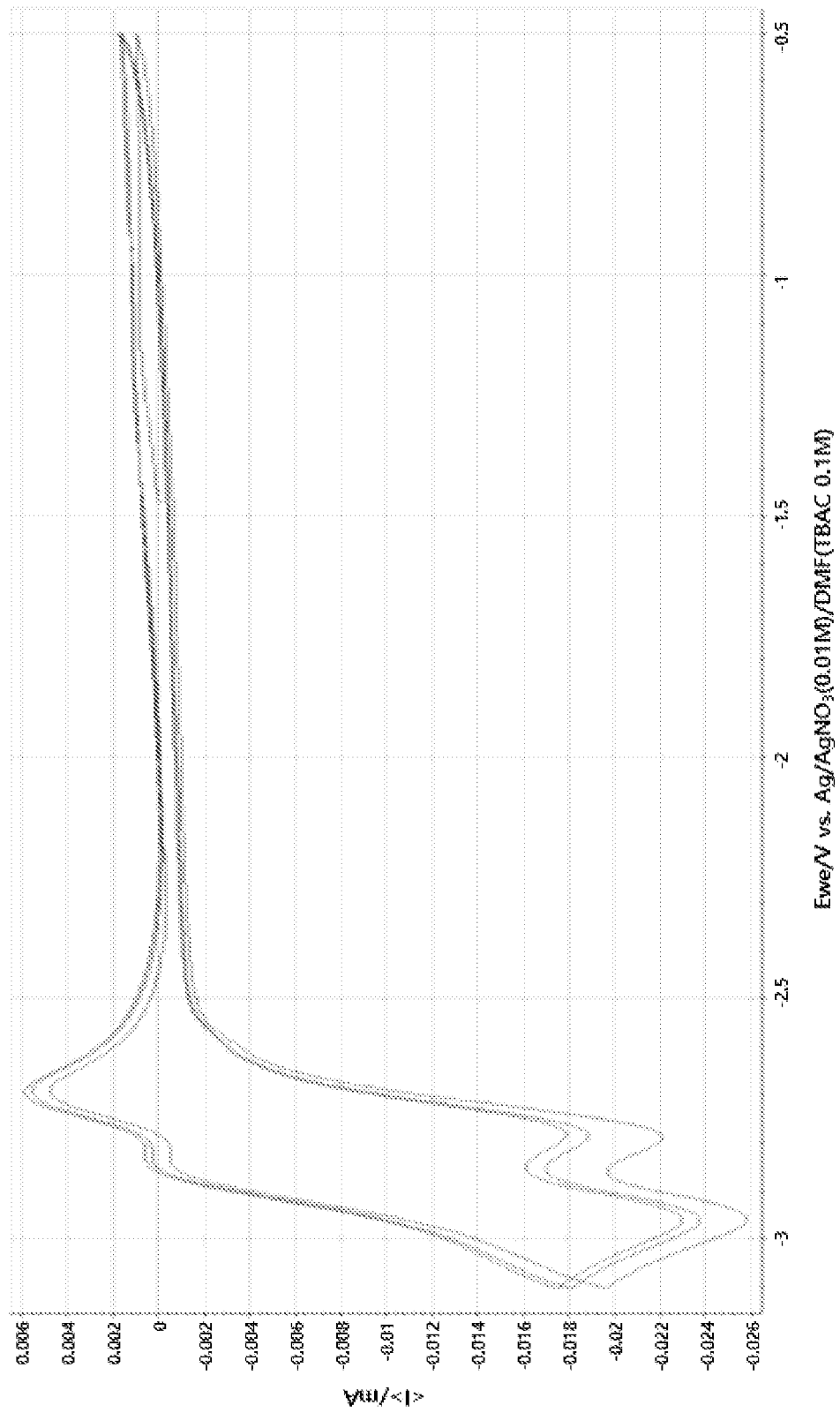
[FIG 22]

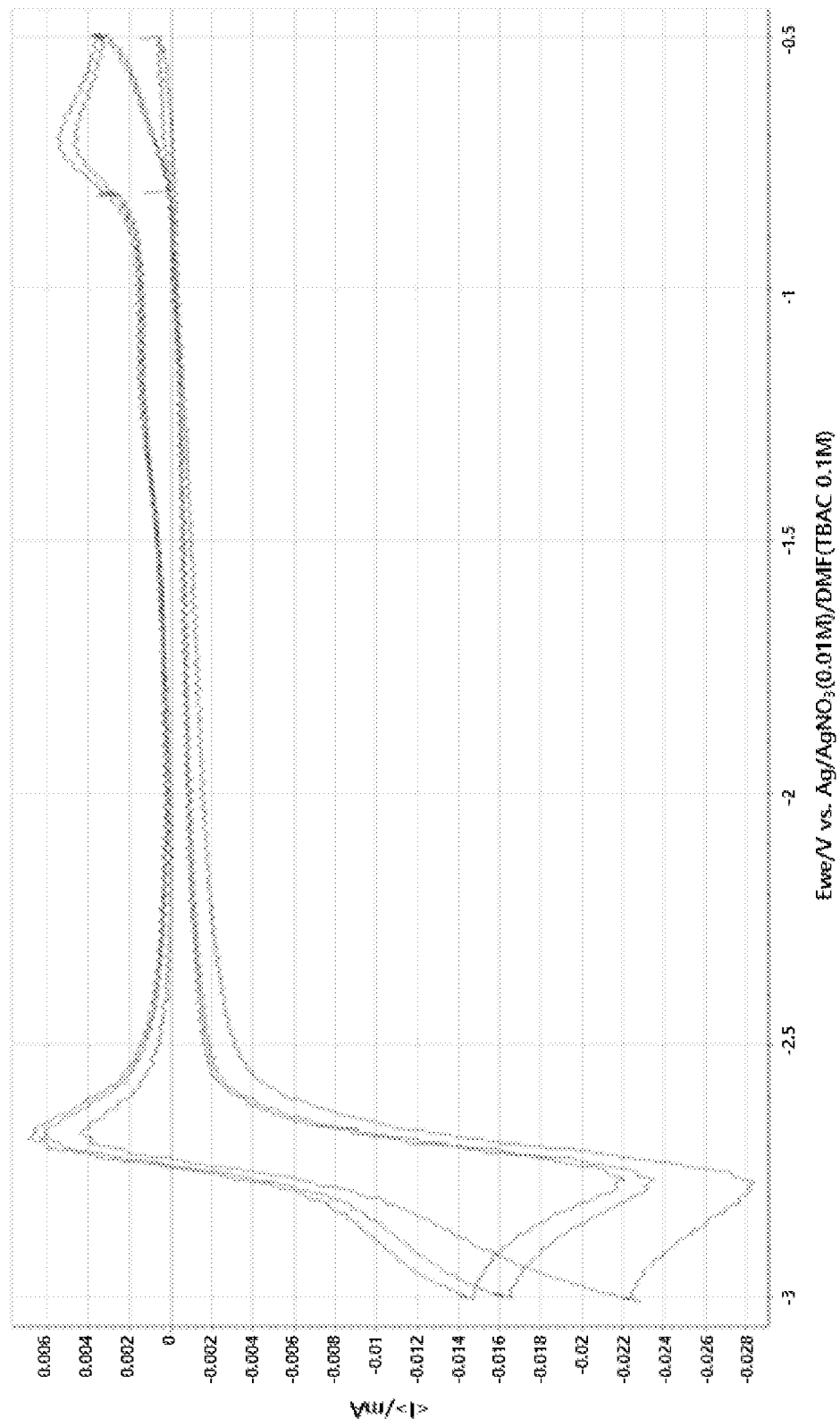
[FIG 23]

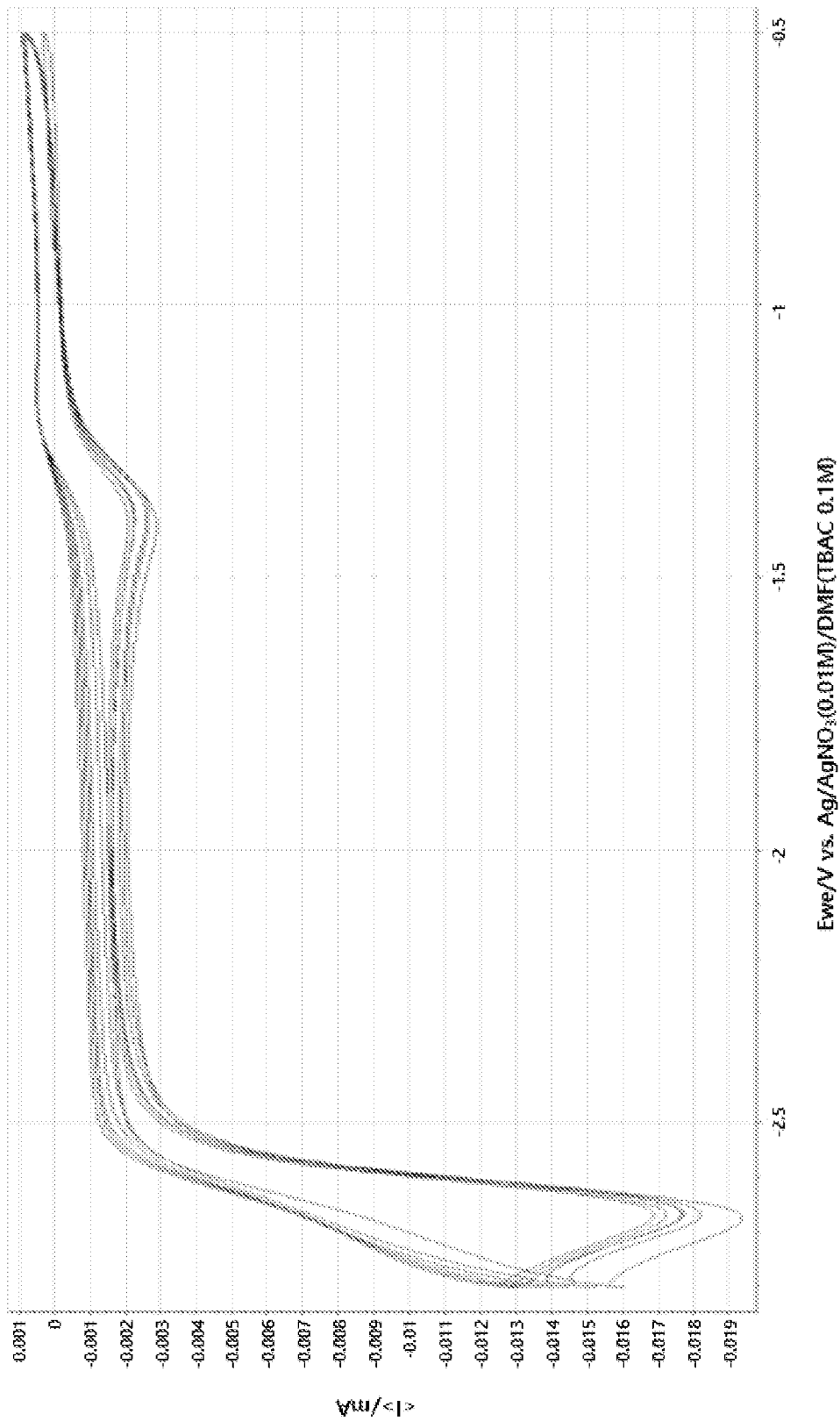
[FIG 24]

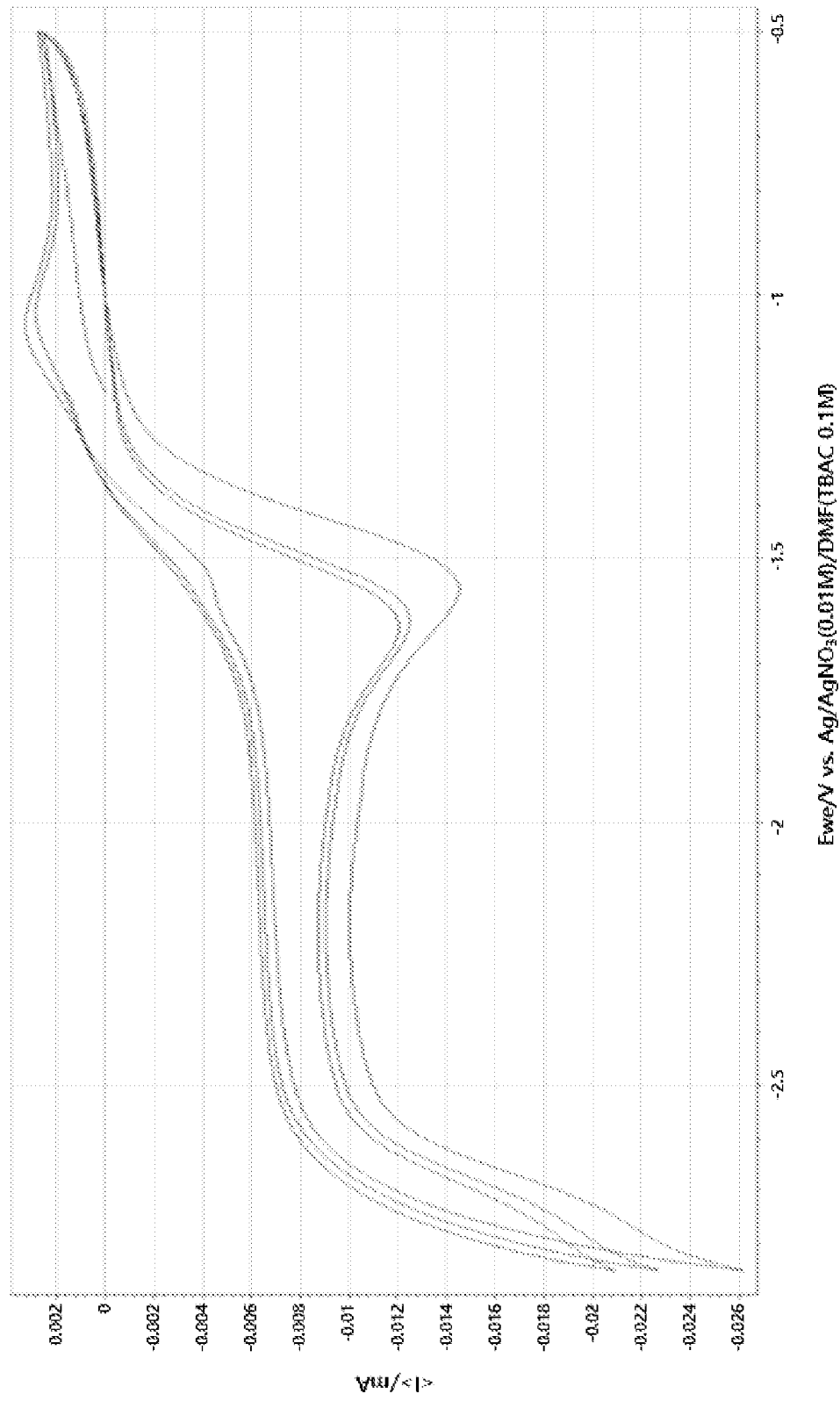
[FIG 25]

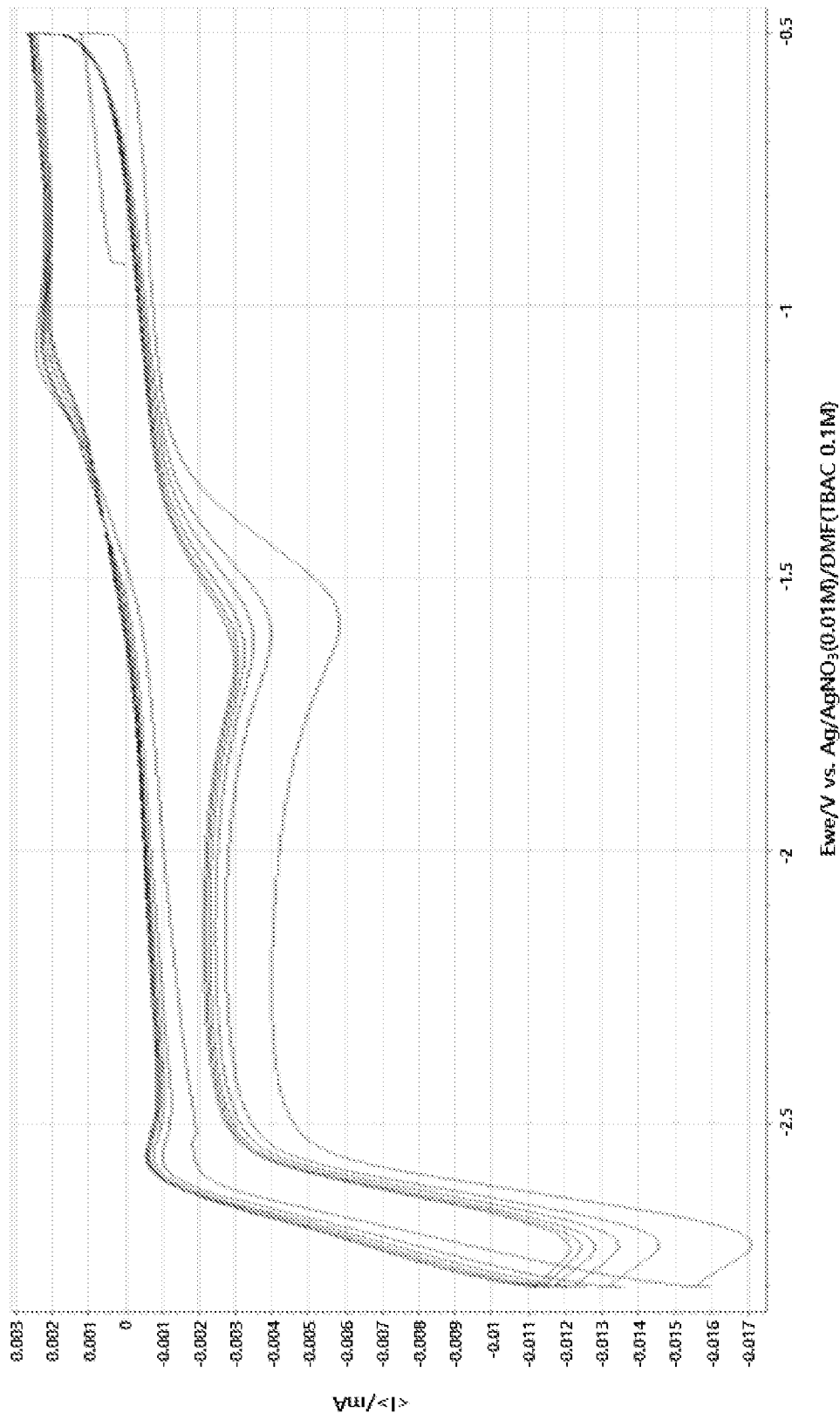
[FIG 26]

[FIG 27]
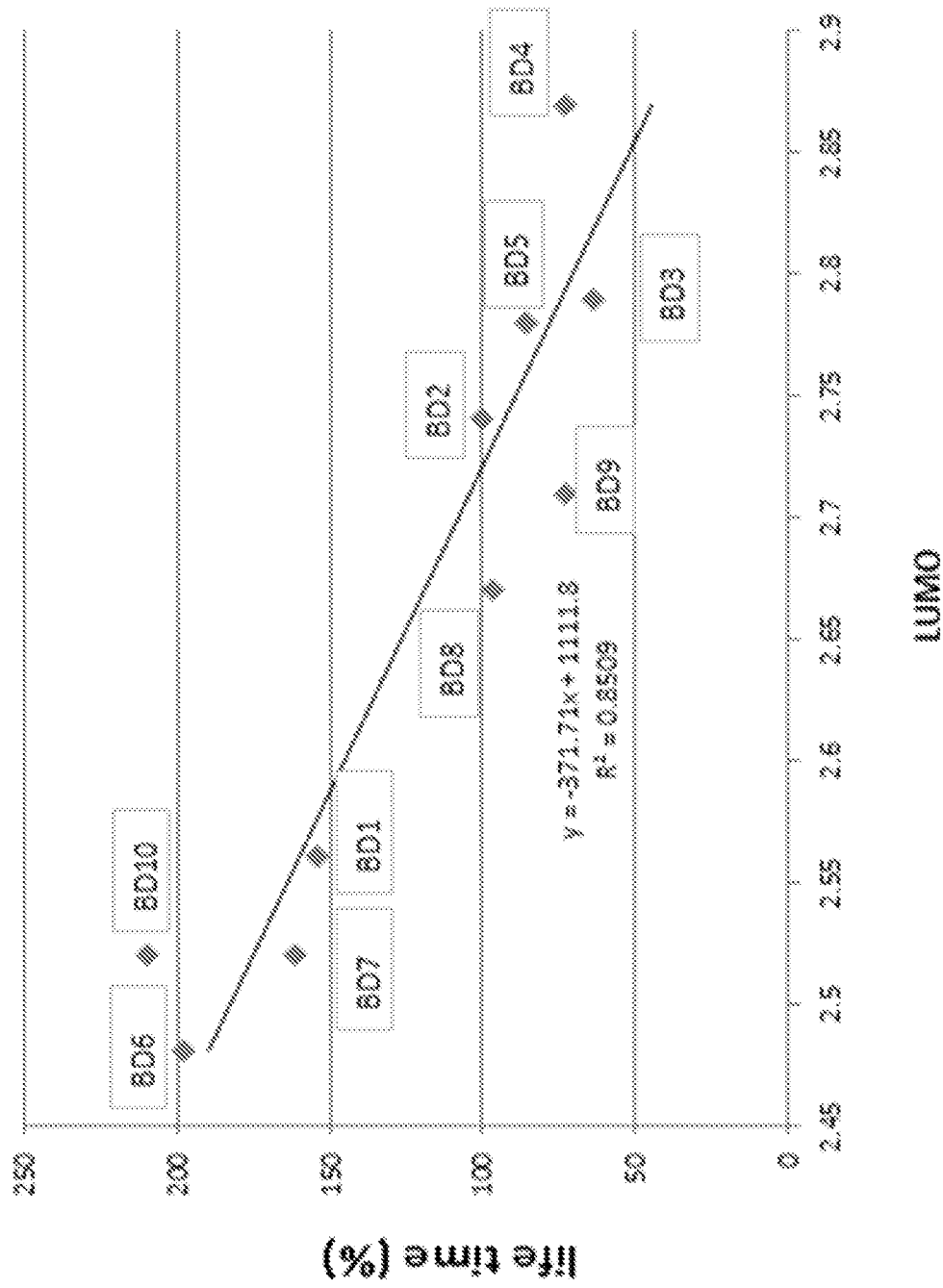

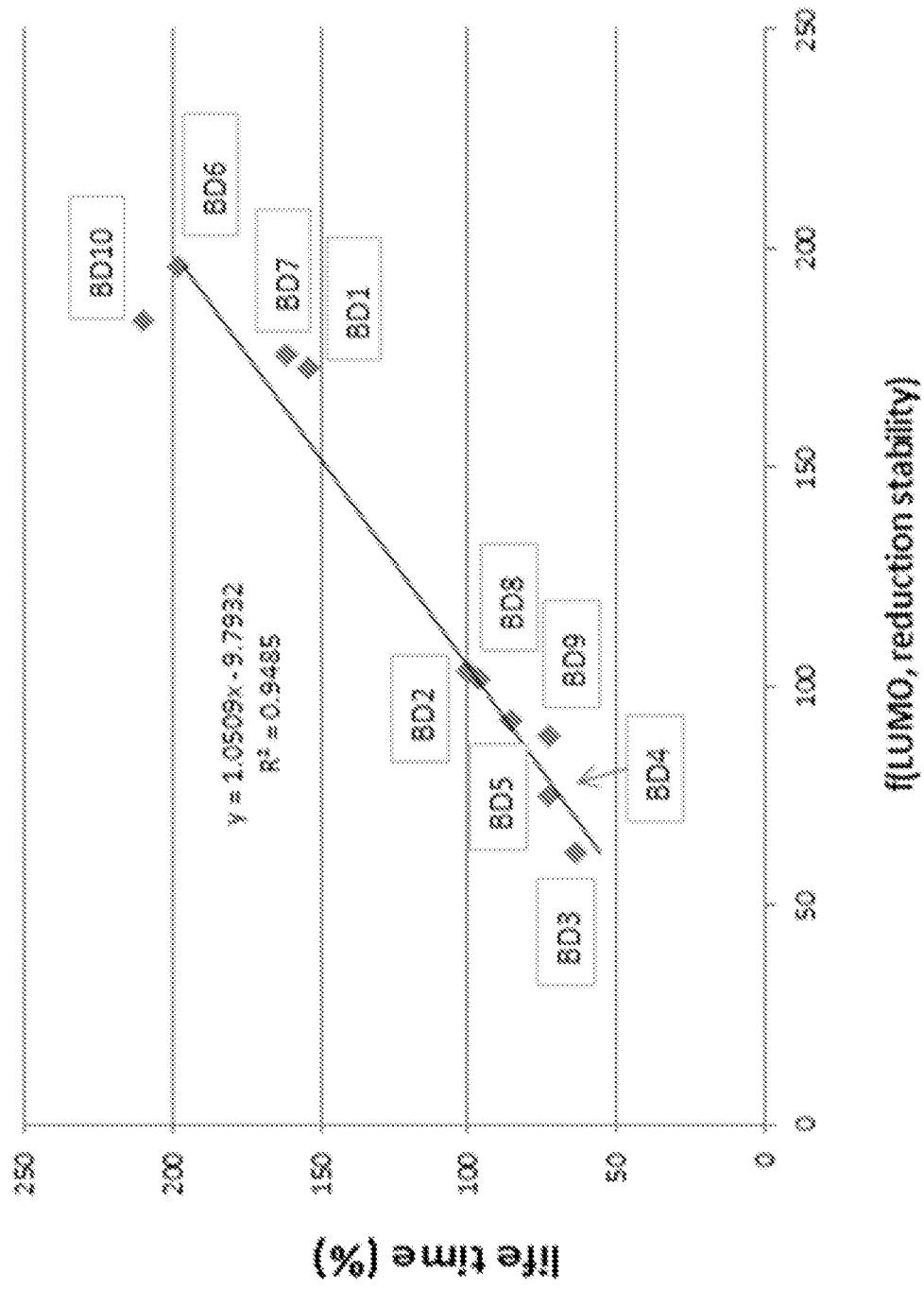
[FIG 28]

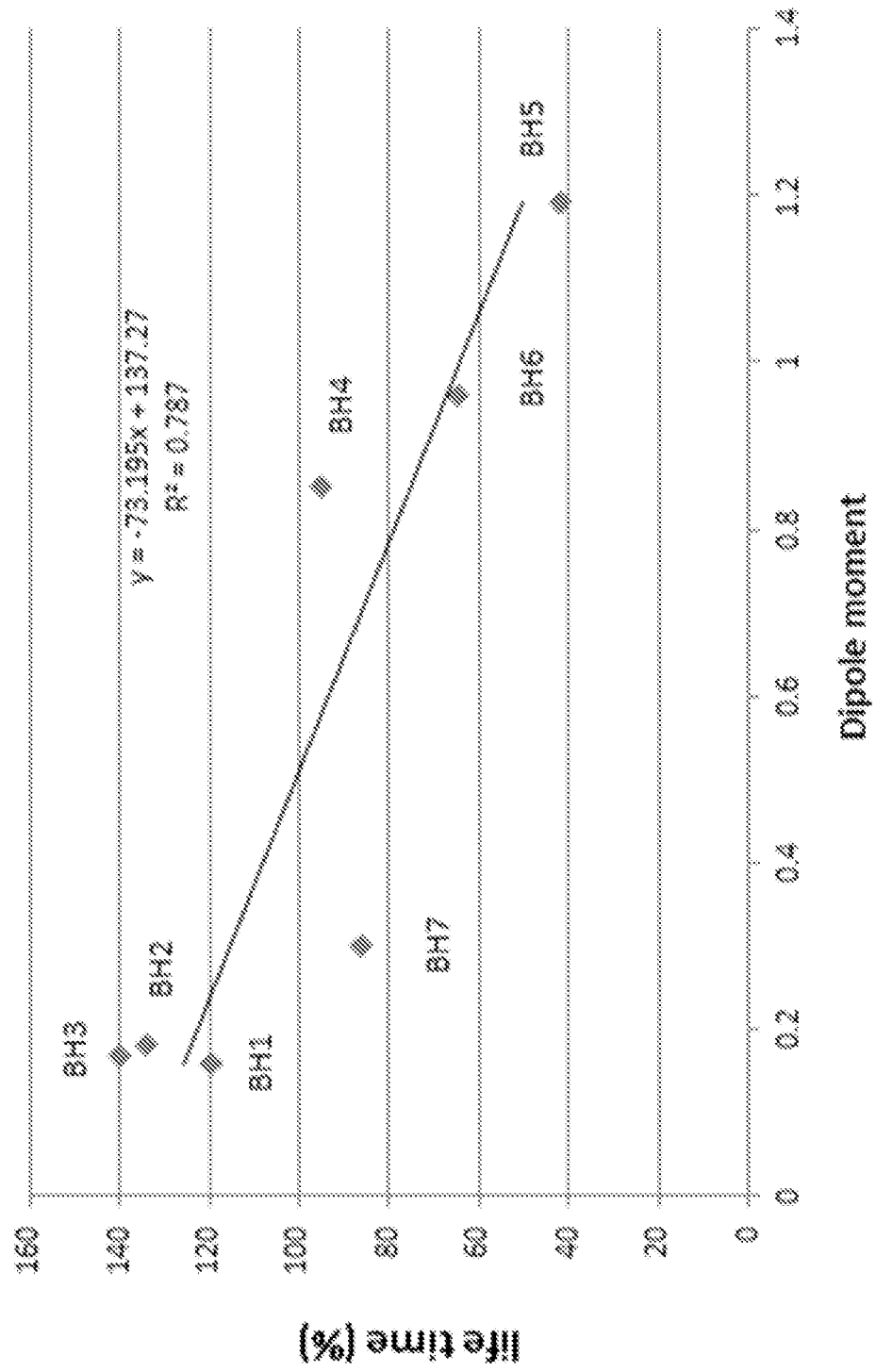
[FIG 29]

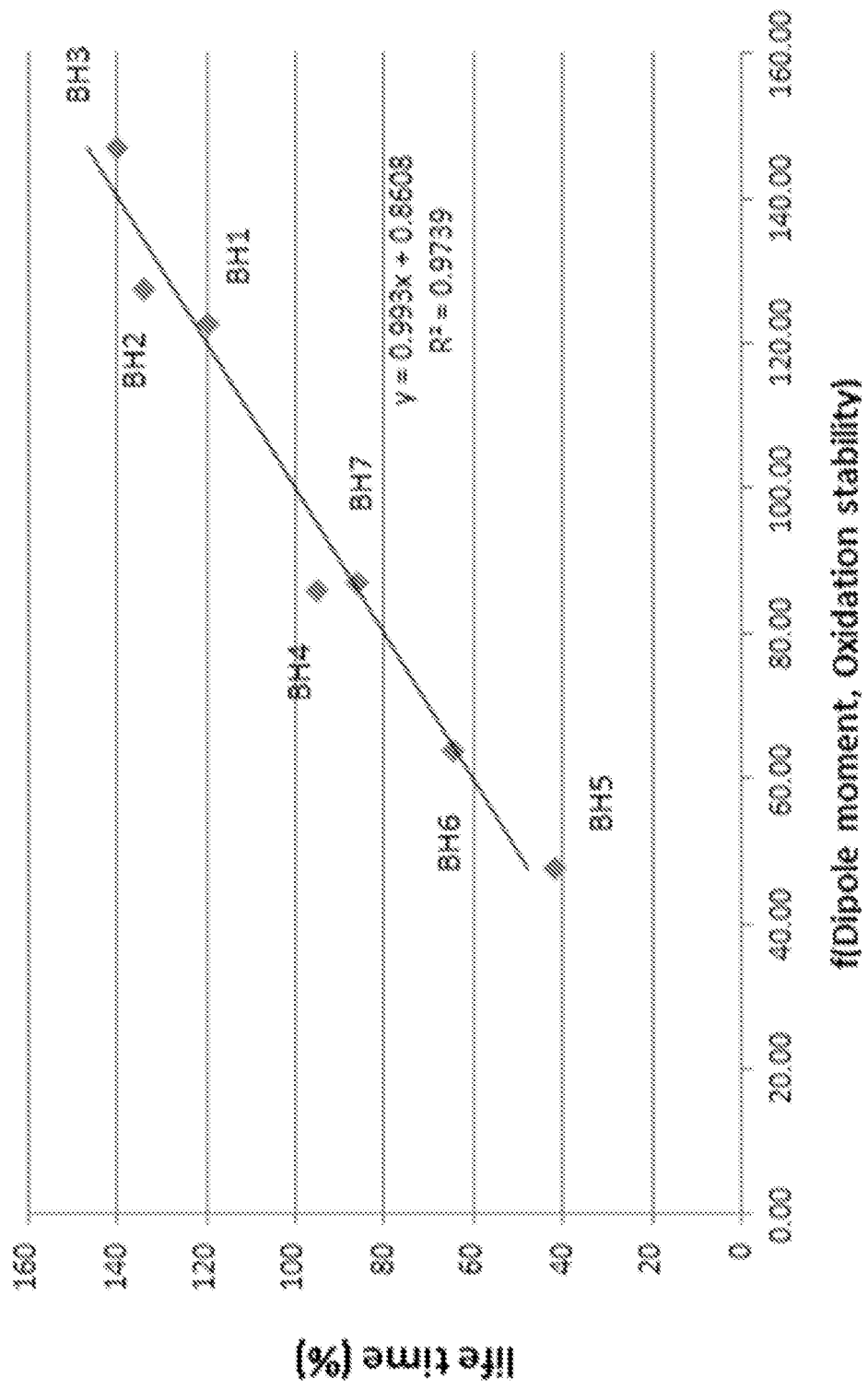
[FIG 30]

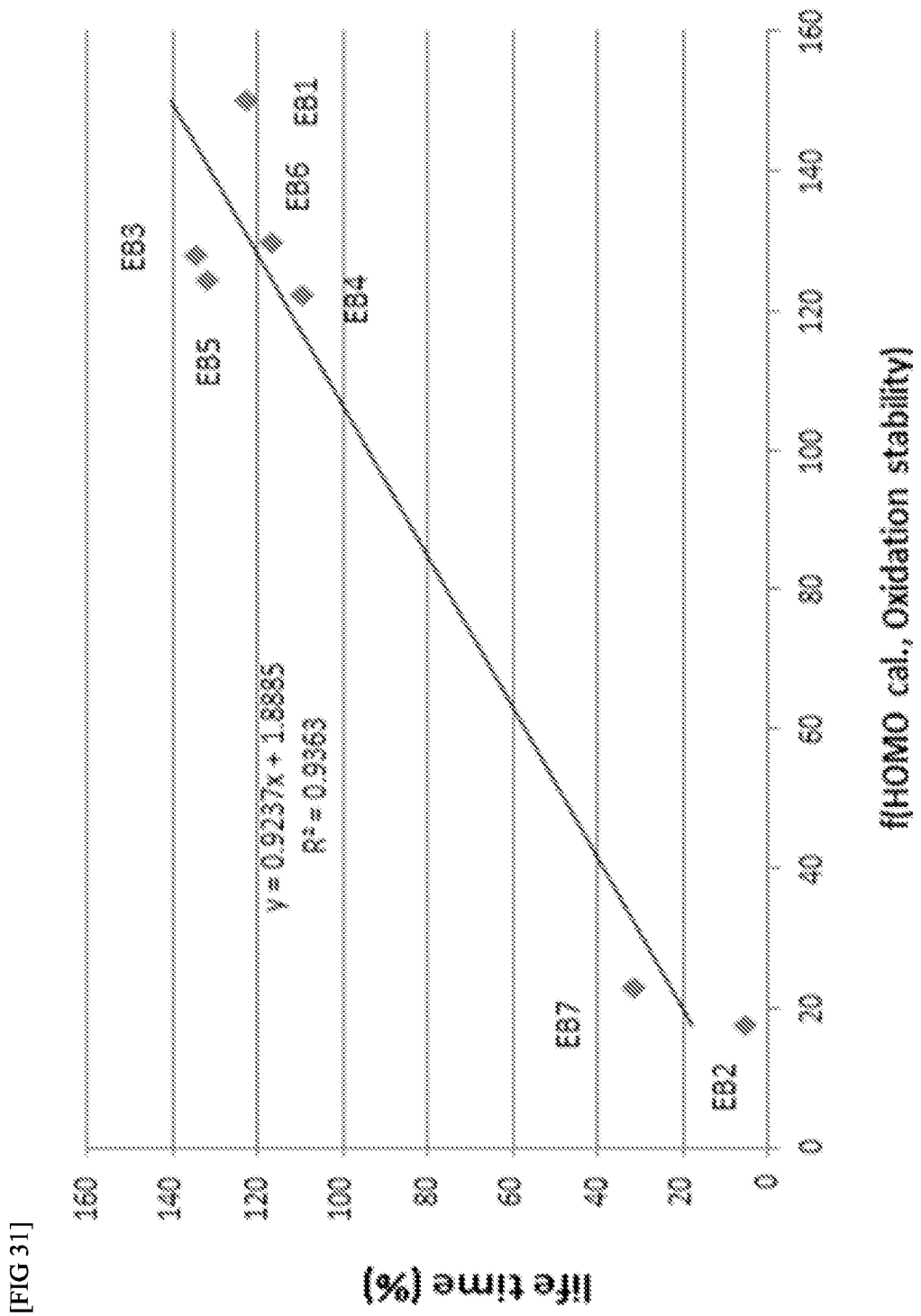
[FIG 31]

METHOD FOR SELECTING MATERIAL FOR ORGANIC LIGHT-EMITTING DEVICE

CROSS-REFERENCE TO RELATED APPLICATION(S)

This application is a National Stage Application of International Application No. PCT/KR2020/006407 filed on May 15, 2020, which claims priority to and the benefit of Korean Patent Application No. 10-2019-0057179 filed in the Korean Intellectual Property Office on May 15, 2019, the entire contents of which are incorporated herein by reference.

TECHNICAL FIELD

The present specification relates to a method for selecting a material for an organic light emitting device.

BACKGROUND

In general, an organic light emitting phenomenon refers to a phenomenon in which electric energy is converted into light energy by using an organic material. An organic light emitting device using the organic light emitting phenomenon typically has a structure including a positive electrode, a negative electrode, and an organic material layer disposed therebetween. Here, the organic material layer can have a multi-layered structure composed of different materials in many cases in order to improve the efficiency and stability of the organic light emitting device, and can be composed of, for example, a hole injection layer, a hole transport layer, a light emitting layer, an electron transport layer, an electron injection layer, and the like.

In order to improve the performance of the organic light emitting device, studies on the use of an appropriate material in an appropriate organic material layer in the structure of the organic light emitting devices have been continuously conducted.

[Prior Art Documents] Korean Patent No. 10-1347240

BRIEF DESCRIPTION

Technical Problem

The present specification has been made in an effort to provide a method for selecting a material for an organic light emitting device, which has good performance, by evaluating reversibility, that is, electrical stability in the (+) radical and (−) radical states of a material for an organic light emitting device, using cyclic voltammetry (CV).

Technical Solution

An exemplary embodiment of the present specification provides a method for selecting a material for an organic light emitting device, the method including: (S1) obtaining the cyclic voltammograms of two or more samples, respectively within an oxidation range or reduction range at one or more scan rates using cyclic voltammetry (CV); and (S2) comparing the reversibilities by using the cyclic voltammogram to classify the samples into Group 1 or Group 2.

In the classifying of the sample of (S2), Group 1 and Group 2 are defined as follows:

<Group 1> Samples having forward and inverse peaks at all scan rates and no impurity peaks at all scan rates or having impurity peaks at one or more scan rates; and <Group 2> Samples having no inverse peaks at one or more scan rates.

In the comparing of the reversibilities of the samples of (S2), the samples in Group 1 are classified as more stable than those in Group 2, among samples having impurity peaks of <Group 1>, samples having high reversibility at the same scan rate or a smaller height ($I_i$) of the impurity peak than a height ($I_f$) of the forward peak are classified as stable, provided that when there is a sample having neither inverse peak nor forward peaks present at one or more scan rates, samples are compared at rates other than the rate at which neither inverse peaks nor forward peaks are present, and among samples belonging to <Group 2>, samples having the smaller maximum rate at which inverse peaks are not present are classified as stable.

Another exemplary embodiment provides a method for selecting a material for an organic light emitting device, the method further including: (S3) selecting a material for a light emitting layer, a hole transport layer, an electron blocking layer, an electron transport layer, or a hole blocking layer of an organic light emitting device based on the comparison of the reversibilities after Step (S2).

Advantageous Effects

A method for selecting a material for an organic light emitting device according to an exemplary embodiment of the present specification can select a material having high electrical stability by evaluating the electrical stability in the (+) and (−) radical states of the material for an organic light emitting device by cyclic voltammetry (CV). The material for an organic light emitting device composed of the material selected by the selection method can have long life time characteristics.

Further, it is possible to predict the life time of the device when the material for an organic light emitting device is used for the device by analyzing the material by cyclic voltammetry (CV) according to the present invention.

BRIEF DESCRIPTION OF THE DRAWINGS

FIG. 1 illustrates a forward peak and an inverse peak within an oxidation range.

FIG. 2 illustrates a forward peak and an inverse peak within a reduction range.

FIGS. 3 to 5 and 9 to 11 are cyclic voltammograms of Compound BD1 within an oxidation range or a reduction range.

FIGS. 6 to 8 and 12 to 14 are cyclic voltammograms of Compound BD4 within an oxidation range or a reduction range.

FIG. 15 is a cyclic voltammogram of Compound BD3 within a reduction range.

FIGS. 16 to 18 are cyclic voltammograms of Compound BD8 within a reduction range.

FIGS. 19 to 23 are cyclic voltammograms of Compounds BD9, BD2, BD5, BD7, and BD10 within a reduction range.

FIGS. 24 to 26 are cyclic voltammograms of Compound BD23 within a reduction range.

FIGS. 27 and 28 are graphs of the life time of a device including a blue light emitting dopant material.

FIGS. 29 and 30 are graphs of the life time of a device including a blue light emitting host material.

FIG. 31 is a graph of the life time of a device including an electron blocking material.

DETAILED DESCRIPTION

Life time characteristics of an organic light emitting device are affected by the electrical stability in the (+) radical or (−) radical state of a material for an organic light emitting device. In the related art, as a method for evaluating the electrical stability of a material for an organic light emitting device, a method for comparing reduced capacitance using a cyclic voltammetry has been used. However, this method does not measure the electrical stability of the (+) radical or (−) radical of a material for an organic light emitting device.

The present invention establishes a method for comparing the stabilities of the (+) and (−) radicals of a sample by analyzing the graph outline of a cyclic voltammogram measured by a cyclic voltammetry (CV) within an oxidation range and a reduction range, and provides a method for selecting a stable material for an organic light emitting device to be applied to an organic material layer of an organic light emitting device.

Further, it is possible to predict the life time of the device when the material for an organic light emitting device is used for the device by analyzing the reversibility, LUMO or HOMO energy, and the like of the material by cyclic voltammetry (CV) according to the present invention.

Hereinafter, the present specification will be described in detail.

In the present specification, the cyclic voltammogram is measured by a VSP model. Specifically, the cyclic voltammetry (CV), which measures current generated by changing voltage, is used. The voltage of the working electrode is changed from the initial voltage ($E_i$) at the constant rate (v) ($E=E_i-vt$, t is time), and the current is measured. In this case, v is called a scan rate.

In the present specification, a peak refers to a point at which the sign of the slope in the graph changes.

In the present specification, the height of a peak refers to a value obtained by subtracting the current value of the baseline from the current value of the corresponding peak in the cyclic voltammogram.

In the present specification, the current value refers to the absolute value of the current in the cyclic voltammogram.

In the present specification, the forward peak refers to the point where the current size is the largest in the forward scan of the cyclic voltammogram. The increased current decreases from the forward peak.

In the present specification, the inverse peak refers to the point where the current size is the largest in the inverse scan of the cyclic voltammogram. The increased current decreases from the inverse peak.

In the present specification, the point where the peak appears except for the forward peak and the inverse peak in the cyclic voltammogram refers to as an impurity peak. The region where the impurity peak appears is not limited to the forward scan or the inverse scan. That is, the impurity peak can appear in the forward scan, can appear in the inverse scan, and can appear in both the forward scan and the inverse scan. There can be one or more impurity peaks.

In the present specification, the oxidation range refers to a voltage range in which oxidation can occur.

In the present specification, the reduction range refers to a voltage range in which reduction can occur.

For example, FIG. 1 illustrates a forward peak and an inverse peak of a certain compound within an oxidation range, and FIG. 2 illustrates a forward peak and an inverse peak of the same compound within a reduction range.

In the present specification, a lowest unoccupied molecular orbital (LUMO) and a highest occupied molecular orbital (HOMO) can be obtained by the cyclic voltammetry.

$$E(\text{HOMO})=[V_{solvent}-(E_{onset\ ox}-E_{1/2}(\text{solvent})]\text{eV}$$

$$E(\text{LUMO})=[V_{solvent}-(E_{onset\ red}-E_{1/2}(\text{solvent})]\text{eV}$$

$V_{solvent}$ is the energy level of the solvent, $E_{1/2}$ is the half-wave level of the solvent, $E_{onset\ ox}$ is the level (potential) of the point where the oxidation starts, and $E_{onset\ red}$ is the level (potential) of the point where the reduction starts.

The HOMO and the LUMO can be measured using an AC3 device, and can also be calculated by a simulation program even in addition to the cyclic voltammetry (CV).

In the present specification, the HOMO or LUMO value to be measured (or calculated) is a value of the measured oxidation potential or reduction potential calibrated by using ferrocene as a calibration material.

HOMO=4.8−(the oxidation potential of ferrocene−the oxidation potential of a sample)

LUMO=4.8−(the oxidation potential of ferrocene−the reduction potential of a sample)

In the present specification, when the HOMO or LUMO is calculated by a simulation program, a Gaussian program or a Schrodinger program can be used as the simulation program. A time-dependent density functional theory (DFT) tool can be used.

In the present specification, the HOMO or LUMO value measured (or calculated) by AC3 is a value obtained by depositing a material onto an ITO film and then putting the deposited ITO film into an AC3 device to measure a work function.

According to an exemplary embodiment of the present specification, as a method of obtaining the cyclic voltammogram, the cyclic voltammogram is obtained under the conditions of $N_2$ gas and an electrolyte (TBAC: tert-butyl acetate) by preparing a sample in which a target compound is dissolved in dimethylformamide (DMF) at a concentration of 0.003 M. In this case, the cyclic voltammogram is fitted by the EC-lab program and is measured by the VSP model.

In the present specification, it is assumed that the current size of the peak at the time of measuring 2 cycles to 10 cycles changes within 3% of the reference value.

The method for selecting a material for an organic light emitting device according to an exemplary embodiment of the present specification compares the degrees of stability from a graph of a cyclic voltammogram measured at one or more scan rates by the cyclic voltammetry (CV).

Specifically, the method for selecting a material for an organic light emitting device includes the following two steps.

(S1) obtaining the cyclic voltammograms of two or more samples, respectively within an oxidation range or reduction range at one or more scan rates using cyclic voltammetry (CV); and (S2) comparing the reversibilities by using the cyclic voltammogram to classify the samples into Group 1 or Group 2.

According to an exemplary embodiment of the present specification, the method for selecting a material for an organic light emitting device further includes: (S3) selecting a material for a light emitting layer, a hole transport layer, an electron blocking layer, an electron transport layer, or a hole blocking layer of an organic light emitting device based on the comparison of the reversibilities after Step (S2).

In the step of obtaining the cyclic voltammograms of (S1), the cyclic voltammograms are obtained at a scan rate (mV/s) at which peaks are observed. When no peak is observed, the cyclic voltammograms are obtained at two or more scan rates (mV/s). Specifically, the cyclic voltage current is measured while increasing or decreasing the scan rate.

According to an exemplary embodiment of the present specification, the cyclic voltammogram of each sample is obtained at one to three scan rate(s).

According to an exemplary embodiment of the present specification, the cyclic voltammogram of each sample is obtained at three scan rates.

According to an exemplary embodiment of the present specification, the scan rate is 1 to 3 of 10 mV/s, 50 mV/s, 100 mV/s, 300 mV/s, and 500 mV/s, respectively.

According to an exemplary embodiment of the present specification, there are three scan rates of 100 mV/s, 300 mV/s, and 500 mV/s; or 50 mV/s, 100 mV/s, and 300 mV/s.

According to an exemplary embodiment of the present specification, there is one scan rate of 100 mV/s.

The cyclic voltage current is measured by dissolving a sample within the oxidation range or reduction range in an organic solvent.

The type of the organic solvent is not limited as long as the organic solvent can dissolve a sample. The organic solvent can be dichloromethane or dimethylformamide (DMF).

According to an exemplary embodiment of the present specification, the organic solvent is dimethylformamide (DMF).

According to an exemplary embodiment of the present specification, the cyclic voltammogram is obtained under the conditions of $N_2$ gas and an electrolyte (TBAC: tert-butyl acetate) by preparing a sample in which a compound is dissolved in dimethylformamide (DMF) at a concentration of 0.003 M. In this case, the cyclic voltammogram is fitted by the EC-lab program and is measured by the VSP model.

Samples can be classified as the following Group 1 or Group 2 based on the cyclic voltammograms obtained by varying the scan rate:

<Group 1> Samples having forward and inverse peaks at all scan rates and no impurity peaks at all scan rates or having impurity peaks at one or more scan rates; or <Group 2> Samples having no inverse peaks at one or more scan rates.

In the comparing of the reversibilities of the samples of (S2), the samples in Group 1 are classified as more stable than those in Group 2.

The comparison criteria between samples belonging to the same group are as follows.

Among samples having no impurity peak in <Group 1>, samples having high reversibility at the same scan rate are classified as stable, among samples having impurity peaks of <Group 1>, samples having high reversibility at the same scan rate or a smaller height ($I_i$) of the impurity peak than a height ($I_f$) of the forward peak are classified as stable, among samples having impurity peaks in <Group 1>, samples having low reversibility at the same scan rate are classified as stable, provided that when there is a sample having neither inverse peak nor forward peaks present at one or more scan rates, samples are compared at rates other than the rate at which neither inverse peaks nor forward peaks are present, and among samples belonging to <Group 2>, samples having the smaller maximum rate at which inverse peaks are not present are classified as stable, the reversibility is calculated by the following Equation 1:

$$\text{Reversibility} = I_r/I_f \qquad \text{<Equation 1>}$$

wherein in Equation 1, $I_r$ means the height of the inverse peak, and $I_f$ means the height of the forward peak.

The height of the peak refers to a value obtained by subtracting the current value in the baseline from the current value of the corresponding peak. Specifically, the height of the peak can be measured from a program which measures the CV.

When samples belonging to <Group 1> are compared, samples are measured and compared with each other at the same reference scan rate. In this case, the reference scan rate refers to a rate at which the graph outlines can be compared among materials while all the corresponding comparative samples have a forward peak and an inverse peak.

When samples belonging to <Group 2> are compared, maximum rates having no inverse peak are compared.

According to the comparison criteria, the stabilities of two or more samples can be ranked by comparing the stabilities among the samples.

When the inverse peak does not appear as in Group 2, the reversibility greatly deteriorates and irreversible properties are exhibited.

The materials for one or more organic material layers of the organic light emitting device are selected by comparing and evaluating the electrical stability of the sample. The organic material layer includes a light emitting layer, a hole injection layer, a hole transport layer, an electron blocking layer, an electron injection layer, an electron transport layer, or a hole blocking layer.

When the reversibility within a reduction range is high, the (−) radical state is stable, and when the reversibility within an oxidation range is high, the (+) radical state is stable. The reversibility can be quantified as a value of the following Equation 1. Specifically, the reversibility in the reference scan rate is defined by the following Equation 1:

$$\text{Reversibility} = I_r/I_f \qquad \text{<Equation 1>}$$

wherein in Equation 1, $I_r$ means the height of the inverse peak, and $I_f$ means the height of the forward peak.

The reference scan rate refers to a rate at which the graph outlines can be compared among materials while all the corresponding comparative samples have a forward peak and an inverse peak.

In the present specification, the oxidation stability is a reversibility value calculated from the cyclic voltammogram obtained within the oxidation range.

In the present specification, the reduction stability is a reversibility value calculated from the cyclic voltammogram obtained within the reduction range.

A material having a high reversibility (reduction stability) within the reduction range has a stable anion radical state. Therefore, when a material having a high reversibility within the reduction range is used as a dopant material of a blue light emitting layer, the life time characteristics of the organic light emitting device can be improved.

A material having a high reversibility (oxidation stability) within the oxidation range has a stable cation radical state. Therefore, when a material having a high reversibility within the oxidation range is used as a host of the blue light emitting layer, hole transport layer, electron blocking layer, electron transport layer or hole blocking layer material, the life time characteristics of the organic light emitting device can be improved.

In an exemplary embodiment of the present specification, a material having a HOMO absolute value of 4.30 eV to 4.60 eV, and a reversibility value $(I_r/I_f)$ of 0.83 or higher within an oxidation range at a scan rate of 100 mV/s at the time of measuring cyclic voltage current can be used as a material for a hole transport layer.

In an exemplary embodiment of the present specification, a material having a reversibility value $(I_r/I_f)$ of more than 0.5 within an oxidation range at a scan rate of 100 mV/s at the time of measuring cyclic voltage current can be used as a material for an electron blocking layer.

In an exemplary embodiment of the present specification, a material having a LUMO absolute value of 2.40 eV to 2.74 eV, and a reversibility value $(I_r/I_f)$ larger than [−23.14+8.458×(the LUMO absolute value)] within a reduction range at a scan rate of 100 mV/s at the time of measuring cyclic voltage current can be used as a dopant material for a blue light emitting layer.

In an exemplary embodiment of the present specification, a material having a LUMO absolute value of 2.60 eV to 2.90 eV, and a reversibility value $(I_r/I_f)$ larger than [4.96−1.535×(the LUMO absolute value)] within a reduction range at a scan rate of 100 mV/s at the time of measuring cyclic voltage current can be used as a material for an electron transport layer.

In an exemplary embodiment of the present specification, a material having both a forward peak and an inverse peak at a scan rate of 100 mV/s at the time of measuring cyclic voltage current within an oxidation range can be used as a material for a hole blocking layer.

In an exemplary embodiment of the present specification, a material having a reversibility value $(I_r/I_f)$ of [1.34×(the dipole moment)−0.293] or higher within an oxidation range at a scan rate of 500 mV/s and a reversibility value $(I_r/I_f)$ of 0.95 or higher within a reduction range at a scan rate of 10 mV/s, at the time of measuring cyclic voltage current can be used as a host material for a blue light emitting layer.

In an exemplary embodiment of the present specification, a material having a reversibility value $(I_r/I_f)$ of [0.955−0.1786×(a stability value $(I_r/I_f)$ within an oxidation range)] or higher within a reduction range at a scan rate of 10 mV/s, at the time of measuring cyclic voltage current can be used as a host material for a light emitting layer.

The present specification provides a material for an organic light emitting device classified by the above-described classification method and an organic light emitting device including the same.

EXAMPLES

Hereinafter, the present specification will be described in detail with reference to Examples for specifically describing the present specification. However, the Examples according to the present specification can be modified in various forms, and it is not interpreted that the scope of the present application is limited to the Examples described in detail below. The Examples of the present application are provided to explain the present specification more completely to a person with ordinary skill in the art.

Experimental Example 1: Selection of Blue Light Emitting Dopant (S1) Obtaining Each Cyclic Voltammogram of Sample Using Cyclic Voltammetry (CV)

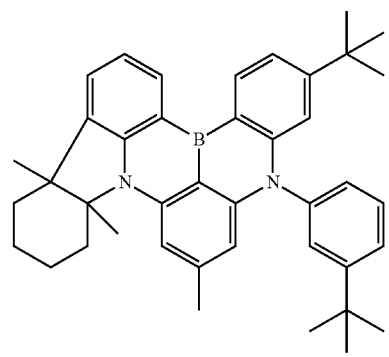

BD1

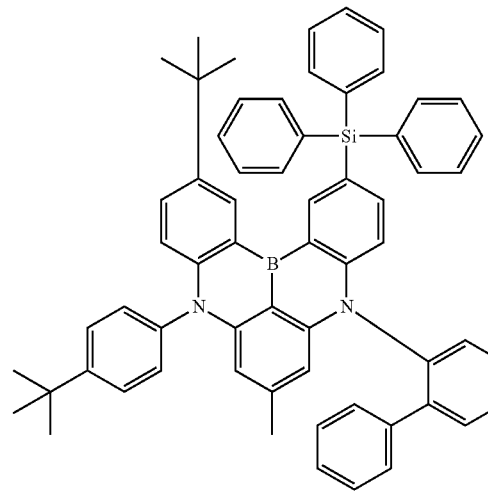

BD2

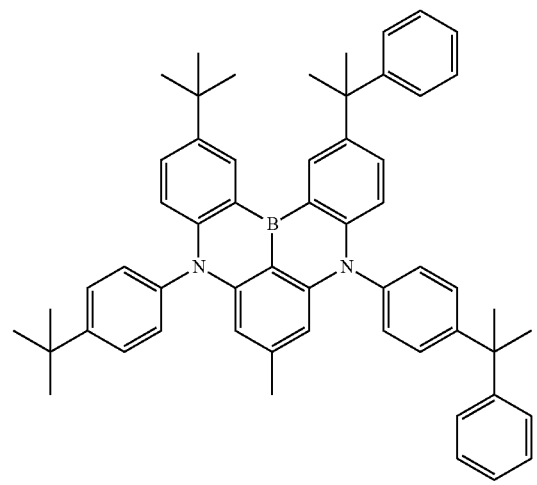

BD3

BD4
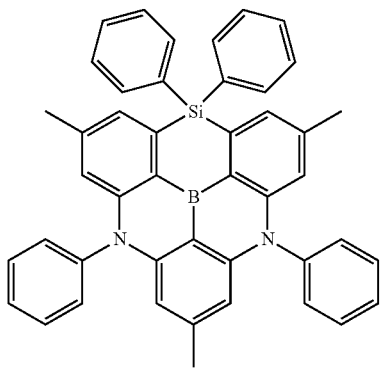
BD8
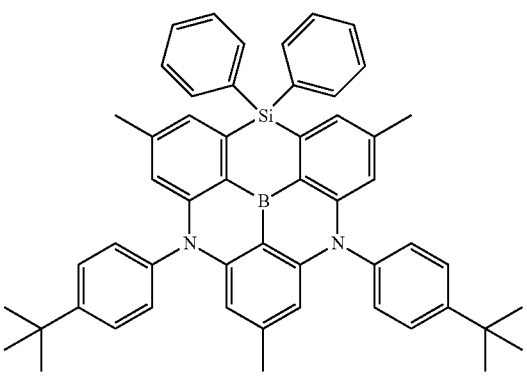
BD5
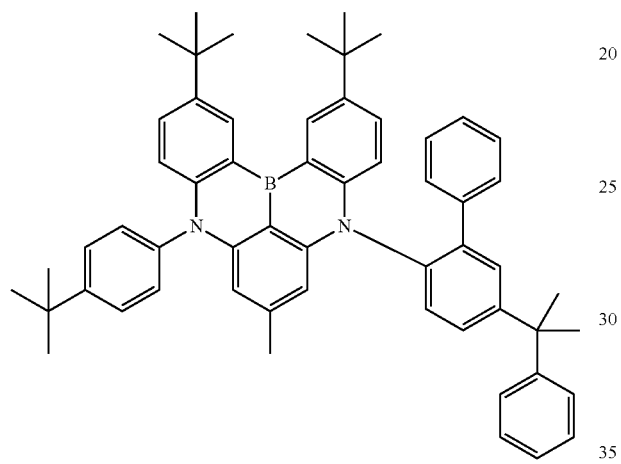
BD9
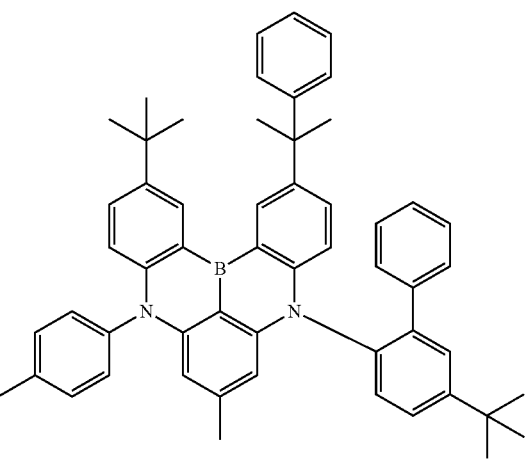
BD6
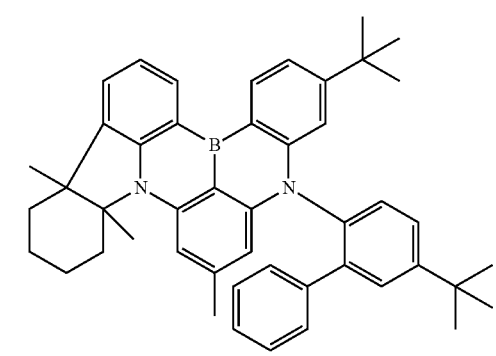
BD7
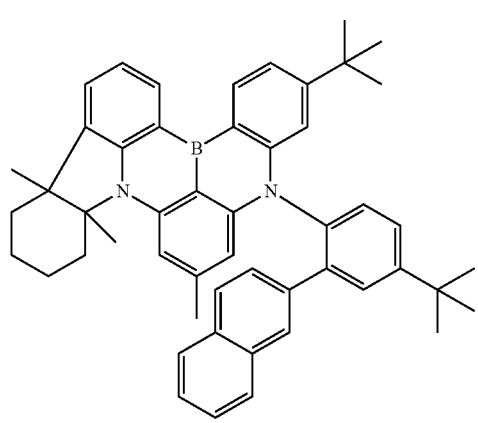
BD10
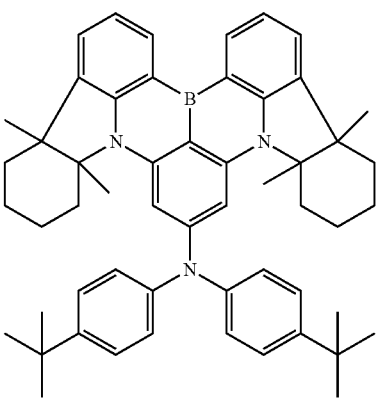

-continued

BD23

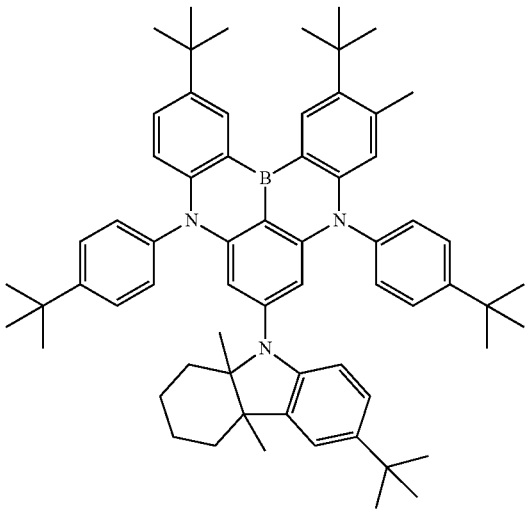

The cyclic voltammogram was obtained under the conditions of $N_2$ gas and an electrolyte (TBAC: tert-butyl acetate) by preparing a sample in which each sample of Compounds BD1 to BD10 and BD23 was dissolved in dimethylformamide (DMF) at a concentration of 0.003 M. In this case, the cyclic voltammogram was fitted by the EC-lab program and was measured by the VSP model. The cyclic voltammograms within an oxidation range or a reduction range were obtained at one to three scan rates selected from 10 mV/s, 50 mV/s, 100 mV/s, 300 mV/s, and 500 mV/s.

The values of the forward peak and the inverse peak are values obtained by setting peaks in the program and calculating the height from the baseline.

A measured oxidation potential or reduction potential was calibrated by using ferrocene as a calibration material to obtain a HOMO or LUMO value.

HOMO=4.8–(the oxidation potential of ferrocene–
the oxidation potential of a sample)

LUMO=4.8–(the oxidation potential of ferrocene–the
reduction potential of a sample)

The following Table 1 shows the cyclic voltammogram in which a forward peak or an inverse peak appeared.

Some of the resulting cyclic voltammograms are as follows.

FIG. 3 is a cyclic voltammogram of Compound BD1 within a reduction range at a scan rate of 100 mV/s, FIG. 4 is a cyclic voltammogram of Compound BD1 within a reduction range at a scan rate of 300 mV/s, and FIG. 5 is a cyclic voltammogram of Compound BD1 within a reduction range at a scan rate of 500 mV/s.

FIG. 6 is a cyclic voltammogram of Compound BD4 within a reduction range at a scan rate of 100 mV/s, FIG. 7 is a cyclic voltammogram of Compound BD4 within a reduction range at a scan rate of 300 mV/s, and FIG. 8 is a cyclic voltammogram of Compound BD4 within a reduction range at a scan rate of 500 mV/s.

FIG. 9 is a cyclic voltammogram of Compound BD1 within an oxidation range at a scan rate of 100 mV/s, FIG. 10 is a cyclic voltammogram of Compound BD1 within an oxidation range at a scan rate of 300 mV/s, and FIG. 11 is a cyclic voltammogram of Compound BD1 within an oxidation range at a scan rate of 500 mV/s.

FIG. 12 is a cyclic voltammogram of Compound BD4 within an oxidation range at a scan rate of 50 mV/s, FIG. 13 is a cyclic voltammogram of Compound BD4 within an oxidation range at a scan rate of 100 mV/s, and FIG. 14 is a cyclic voltammogram of Compound BD4 within an oxidation range at a scan rate of 300 mV/s.

FIG. 15 is a cyclic voltammogram of Compound BD3 within a reduction range at a scan rate of 100 mV/s.

FIG. 16 is a cyclic voltammogram of Compound BD8 within a reduction range at a scan rate of 100 mV/s, FIG. 17 is a cyclic voltammogram of Compound BD8 within a reduction range at a scan rate of 300 mV/s, and FIG. 18 is a cyclic voltammogram of Compound BD8 within a reduction range at a scan rate of 500 mV/s.

FIG. 19 is a cyclic voltammogram of Compound BD9 within a reduction range at a scan rate of 100 mV/s.

FIG. 20 is a cyclic voltammogram of Compound BD2 within a reduction range at a scan rate of 100 mV/s.

FIG. 21 is a cyclic voltammogram of Compound BD5 within a reduction range at a scan rate of 100 mV/s.

FIG. 22 is a cyclic voltammogram of Compound BD7 within a reduction range at a scan rate of 100 mV/s.

FIG. 23 is a cyclic voltammogram of Compound BD10 within a reduction range at a scan rate of 100 mV/s.

FIG. 24 is a cyclic voltammogram of Compound BD23 within a reduction range at a scan rate of 50 mV/s, FIG. 25 is a cyclic voltammogram of Compound BD23 within a reduction range at a scan rate of 100 mV/s, and FIG. 26 is a cyclic voltammogram of Compound BD23 within a reduction range at a scan rate of 300 mV/s.

(S2) Comparing Reversibilities by Classifying Samples

The compounds were classified into Group 1 or Group 2 through the cyclic voltammograms obtained above.

Compounds BD1, BD2, BD4, BD5, BD7, and BD10 are samples having forward and inverse peaks at all scan rates and no impurity peaks at all scan rates or having impurity peaks at one or more scan rates, and were classified as Group 1.

Compounds BD3, BD8, BD9, and BD23 are samples having no inverse peaks at one or more scan rates, and were classified as Group 2.

The following Table 1 shows a comparison of the reversibilities ($I_r/I_f$) of Compounds BD1 and BD4 in Group 1 at a scan rate of 100 mV/s.

TABLE 1

| Compound | | $I_r/I_f$ in 100 mV/s |
|---|---|---|
| BD1 | Reduction range | 0.86 |
| | Oxidation range | 0.76 |
| BD4 | Reduction range | 0.34 |
| | Oxidation range | 0.91 |

Since the reversibility value of BD1 within a reduction range is larger than that of BD4, the (−) radical of BD1 was classified as more stable than the (−) radical of BD4. Further, since the reversibility value of BD4 within an oxidation range is larger than that of BD1, the (+) radical of BD4 was classified as more stable than the (+) radical of BD1.

When Compounds BD8 and BD23 of Group 2 were compared with each other, the maximum rate at which an inverse peak appears within a reduction range is 300 mV/s for BD23 and 500 mV/s for BD8. Therefore, the (−) radical of BD23, which has a lower maximum rate, was classified as more stable.

As described above, a material for an organic light emitting device can be selected by evaluating the reversibility of the compound in the (+) and (−) radical states.

Evaluation of Organic Light Emitting Device (Manufacture of Organic Light Emitting Device)

Example 1-1

A substrate on which ITO was deposited to have a thickness of 30 Å as a positive electrode was cut into a size of 50 mm×50 mm×0.5 mm, put in distilled water in which a detergent was dissolved, and ultrasonically cleaned. A product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, acetone, and methanol solvents in this order, and drying was then conducted.

Compounds HTL1 and P1 shown below were vacuum-deposited at a weight ratio of 97:3 on the thus-prepared positive electrode, thereby forming a hole injection layer having a thickness of 106 Å. And then, the below Compound HTL1 was vacuum-deposited to have a thickness of 1000 Å on the hole injection layer, thereby forming a hole transport layer. And then, the below Compound HTL2 was vacuum-deposited to have a thickness of 40 Å on the hole transport layer, thereby forming an electron blocking layer.

And then, a host BH and a dopant BD1 shown below were vacuum-deposited at a weight ratio of 97:3 on the electron blocking layer, thereby forming a blue light emitting layer having a thickness of 190 Å.

And then, a hole blocking material xETL shown below was vacuum-deposited to have a thickness of 50 Å on the light emitting layer, thereby forming a hole blocking layer, and then the electron transport material (ETL) shown below and LiQ were vacuum-deposited at a weight ratio of 50:50, thereby forming an electron transport layer having a thickness of 250 Å. Sequentially, after LiQ having a thickness of 7 Å was film-formed as an electron injection layer, magnesium and silver (10:1) as a negative electrode were formed to have a thickness of 100 Å, and then a capping layer (CPL) shown below was deposited to have a thickness of 800 Å, thereby completing a device.

In the aforementioned procedure, the deposition rates of the organic materials were each maintained at 1 Å/sec. In this case, vacuum deposition of each layer was performed using a cluster type $1.0\times10^{-7}$ vacuum deposition machine (manufactured by Selcos).

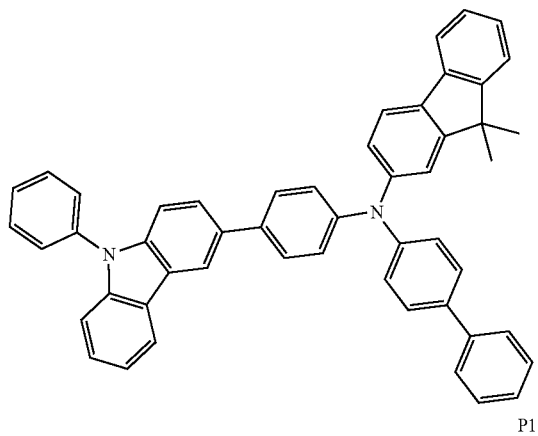

HTL1

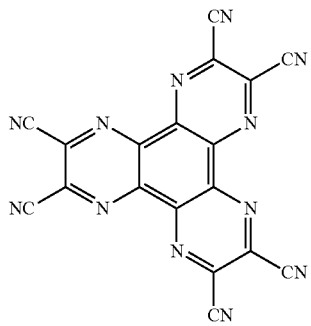

P1

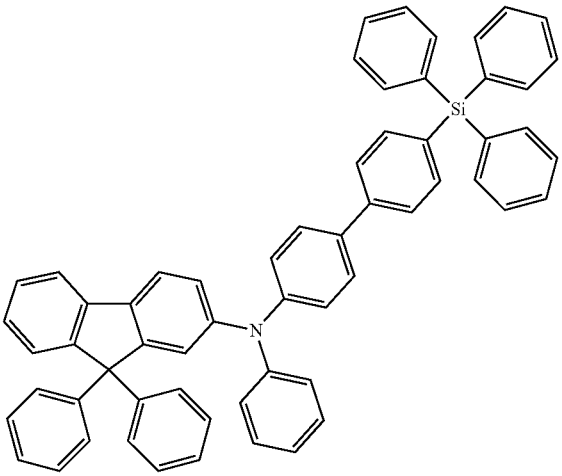

HTL2

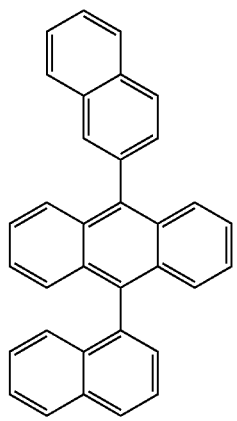

BH

BD1

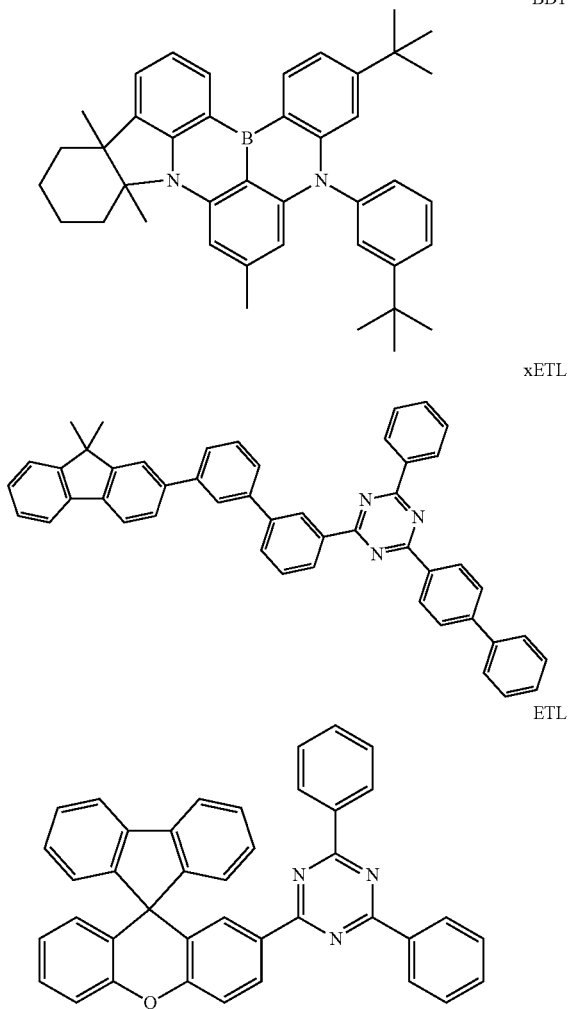

xETL

ETL

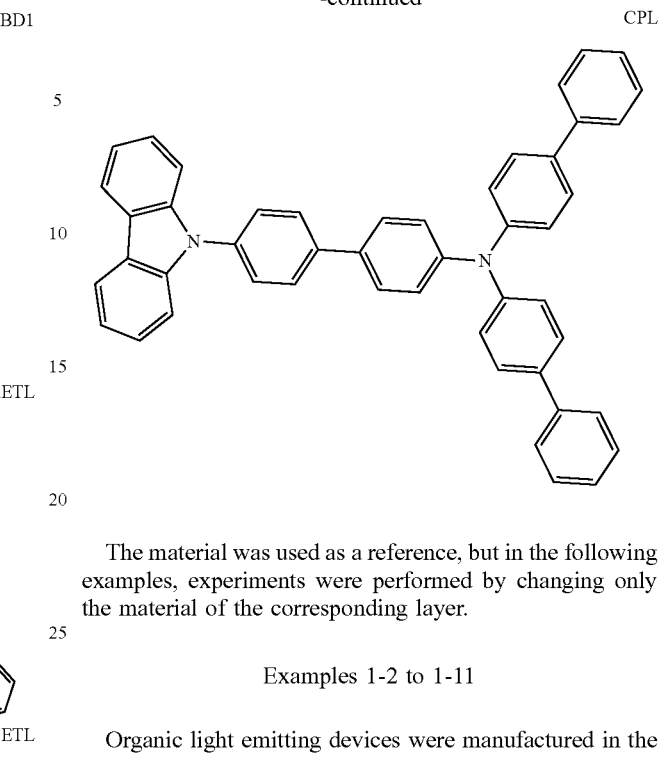

CPL

The material was used as a reference, but in the following examples, experiments were performed by changing only the material of the corresponding layer.

Examples 1-2 to 1-11

Organic light emitting devices were manufactured in the same manner as in Example 1-1, except that the material described in the following Table 2 was used as a blue light emitting dopant material. The data of the manufactured device was measured, the life time was predicted based on the reversibility, and the results are shown in the following Table 2.

In the following Tables 2 to 4, the calculated LUMO or the calculated HOMO is the absolute value of LUMO or HOMO calculated by a time-dependent density functional theory (DFT) of the Gaussian program. The AC3 LUMO or AC3 HOMO is a HOMO or LUMO value measured by AC3.

TABLE 2

| Examples | Dopant Compound | AC3 HOMO | AC3 LUMO | reduction $I_r/I_f$ in 100 mV/s | Prediction of life time Life time(%) = f(LUMO, reduction stability) | Device data (measured value) Efficiency | Life time |
|---|---|---|---|---|---|---|---|
| 1-1 | BD1 | 5.25 | 2.56 | 0.86 | 172 | 91 | 155 |
| 1-2 | BD2 | 5.42 | 2.74 | 0.64 | 104 | 100 | 100 |
| 1-3 | BD3 | 5.46 | 2.79 | 0.00 | 62 | 119 | 64 |
| 1-4 | BD4 | 5.52 | 2.87 | 0.76 | 75 | 96 | 73 |
| 1-5 | BD5 | 5.46 | 2.78 | 0.68 | 92 | 113 | 85 |
| 1-6 | BD6 | 5.16 | 2.48 | 0.78 | 196 | 100 | 198 |
| 1-7 | BD7 | 5.2 | 2.52 | 0.60 | 175 | 96 | 162 |
| 1-8 | BD8 | 5.31 | 2.67 | 0.00 | 102 | 112 | 96 |
| 1-9 | BD9 | 5.39 | 2.71 | 0.00 | 89 | 111 | 73 |
| 1-10 | BD10 | 5.22 | 2.542 | 0.80 | 183 | 100 | 216 |
| 1-11 | BD23 | 5.30 | 2.62 | 0.00 | 119 | 120 | 117 |

In the case of the blue light emitting dopant, the stability of the (−) radical is a factor affecting the life time. Although a method of predicting the life time with LUMO energy is known, the life time can be predicted more accurately when the life time is predicted in consideration of the reversibility evaluated by the present invention.

FIG. 27 is a graph predicting the life time of the device based on the LUMO energy of Compounds BD1 to BD10, and FIG. 28 is a graph predicting the life time of the device in consideration of the LUMO energy and the reversibility (reduction stability=reduction $I_r/I_f$ in 100 mV/s) within a reduction range.

[FIG. 27]

$R2=0.8509$ life time=−371.71×LUMO+1111.8

[FIG. 28]

$R2=0.9485$ life time=$f$(LUMO, reduction stability)=991−333×LUMO+39.37×(reduction stability)

In FIGS. 27 and 28, the respective points indicate the LUMO, reduction stability and the actual life time of Compounds BD1 to BD10, and the solid line is the prediction of the life time along the x-axis (LUMO in FIG. 27, and f (LUMO, reduction stability) in FIG. 28).

Referring to FIG. 28, it can be seen that predicting the life time in consideration of reduction stability is approaching the actual life time value.

In addition, referring to Table 2, it can be seen that that Compounds BD1, BD6, BD7 and BD10 of Group 1 have excellent life times. It can be seen that when the life times of the devices to which BD1, BD4, BD8 and BD23 are applied of which the stabilities of the (−) radical are compared, the life time of the device including BD1 is better than that of the device including BD4 and the life time of the device including BD23 is better than that of the device including BD8.

Experimental Example 2: Selection of Blue Host

A blue host can be selected by the method as in Experimental Example 1. The reversibilities of the following Compounds BH1 to BH7 were evaluated, the devices of Examples 2-1 to 2-7 having the following device structures were manufactured, and the life times of the devices were predicted and measured, and are shown in the following Table 3. In this case, the device was manufactured by changing only BH in Example 1-1.

TABLE 3

| Examples | Host Compound | Dipole moment | oxidation $I_r/I_f$ in 500 mV/s | reduction $I_r/I_f$ in 10 mV/s | Prediction of life time Life time (%) = f (D.M, reduction stability) | Life time (measured value) |
|---|---|---|---|---|---|---|
| 2-1 | BH1 | 0.16 | 0.510 | 0.951 | 122.50 | 120 |
| 2-2 | BH2 | 0.18 | 0.605 | 0.904 | 127.49 | 134 |
| 2-3 | BH3 | 0.17 | 0.857 | 1.085 | 146.65 | 140 |
| 2-4 | BH4 | 0.85 | 0.930 | 0.951 | 85.89 | 95 |
| 2-5 | BH5 | 1.19 | 0.855 | 0.987 | 47.45 | 42 |
| 2-6 | BH6 | 0.96 | 0.773 | 0.981 | 63.88 | 65 |
| 2-7 | BH7 | 0.30 | 0.205 | 0.972 | 86.89 | 86 |

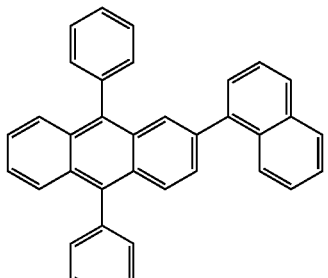

BH1

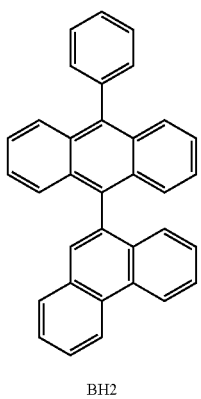

BH2

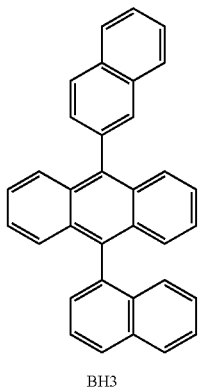

BH3

TABLE 3-continued

| Examples | Host Compound | Dipole moment | oxidation $I_r/I_f$ in 500 mV/s | reduction $I_r/I_f$ in 10 mV/s | Prediction of life time Life time (%) = f (D.M, reduction stability) | Life time (measured value) |
|---|---|---|---|---|---|---|
| | BH4 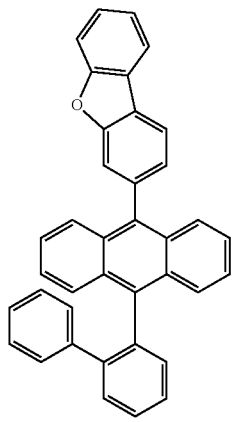 | | | | | |
| | BH5 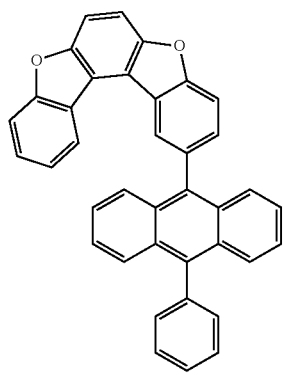 | | | | | |
| | BH6 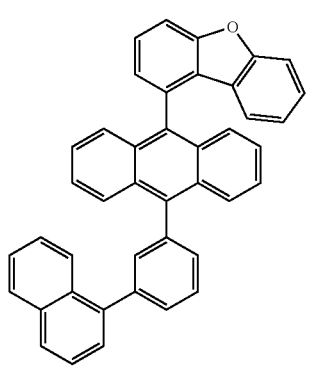 | | | | | |
| | BH7 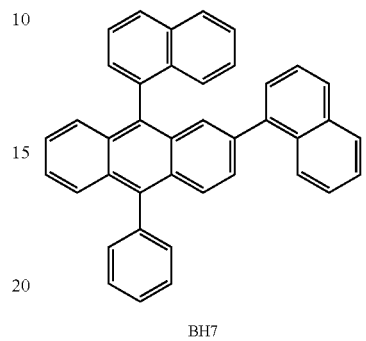 | | | | | |

In the case of the blue light emitting host, the stability of the (+) radical is a factor affecting the life time. Although a method of predicting the life time with dipole moment (D.M) is known, the life time can be predicted more accurately when the life time is predicted in consideration of the reversibility evaluated by the present invention.

In the present specification, the dipole moment (D.M) (Debye) was calculated using a quantum chemical calculation program Gaussian 03 manufactured by U.S. Gaussian Corporation, and a density functional theory (DFT) was used and the calculated value of the triplet energy was obtained by the time-dependent-density functional theory (TD-DFT) with respect to a structure optimized using B3LYP as a functional and 6-31G* as a basis function.

FIG. 29 is a graph predicting the life time of the device based on the dipole moment of each of Compounds BH1 to BH7, and FIG. 30 is a graph predicting the life time of the device in consideration of the dipole moment and the reversibility (oxidation stability=oxidation $I_r/I_f$ in 100 mV/s) within an oxidation range.

[FIG. 29]

$R2=0.787$ life time=$-73.195 \times$D.M$+137.27$

[FIG. 30]

$R2=0.9739$ life time=$f$(D.M, oxidation stability)=$101.2+72.3 \times$ D.M$+97.1 \times$(oxidation stability)

In FIGS. 29 and 30, the respective points indicate the D.M, oxidation stability and the actual life time of Compounds BH1 to BH7, and the solid line is the prediction of the life time along the x-axis (D.M in FIG. 29, and f (D.M, oxidation stability) in FIG. 30).

Referring to FIG. 30, it can be seen that predicting the life time in consideration of oxidation stability is approaching the actual life time value.

Experimental Example 3: Selection of Electron Blocking Material

An electron blocking material can be selected by the method as in Experimental Example 1. The reversibilities of the following Compounds EB1 to EB7 were evaluated, the devices of Examples 3-1 to 3-7 having the following device structures were manufactured, and the life times of the devices were predicted and measured, and are shown in the following Table 3. In this case, the device was manufactured by changing only the electron blocking material (HTL2) in Example 1-1.

TABLE 4

| Examples | Electron transport Compound | Oxidation $I_r/I_f$ in 100 mV/s | Calculated HOMO | Prediction of life time Life time (%) = f (D.M, reduction stability) | Life time (measured value) |
| --- | --- | --- | --- | --- | --- |
| 3-1 | EB1 | 0.976 | 4.31 | 150 | 123 |
| 3-2 | EB2 | 0.300 | 4.63 | 18 | 6 |
| 3-3 | EB3 | 0.979 | 4.58 | 128 | 135 |
| 3-4 | EB4 | 0.948 | 4.59 | 122 | 110 |
| 3-5 | EB5 | 0.968 | 4.6 | 124 | 132 |
| 3-6 | EB6 | 1.001 | 4.6 | 130 | 117 |
| 3-7 | EB7 | 0.324 | 4.61 | 23 | 32 |

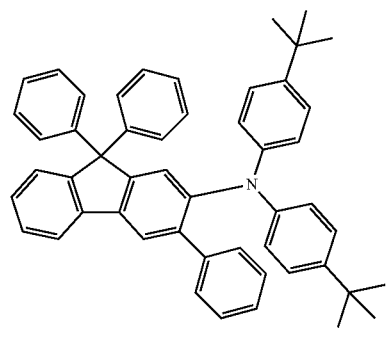

EB1

TABLE 4-continued

| Examples | Electron transport Compound | Oxidation $I_r/I_f$ in 100 mV/s | Calculated HOMO | Prediction of life time Life time (%) = f (D.M, reduction stability) | Life time (measured value) |
| --- | --- | --- | --- | --- | --- |

EB3

EB4

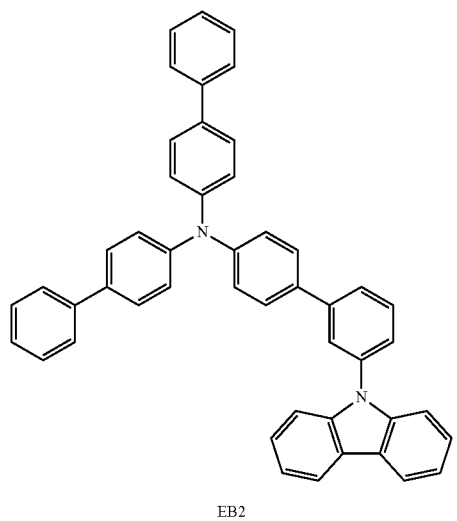 [SMILES: c1ccc(-c2ccc(N(c3ccc(-c4ccccc4)cc3)c3ccc(-c4cccc(-n5c6ccccc6c6ccccc65)c4)cc3)cc2)cc1]

EB2

EB5

TABLE 4-continued

| Examples | Electron transport Compound | Oxidation $I_r/I_f$ in 100 mV/s | Calculated HOMO | Prediction of life time Life time (%) = f (D.M, reduction stability) | Life time (measured value) |
|---|---|---|---|---|---|

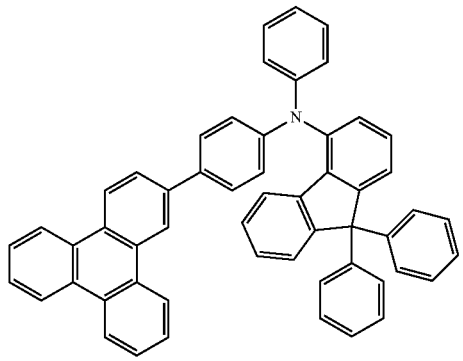

EB6

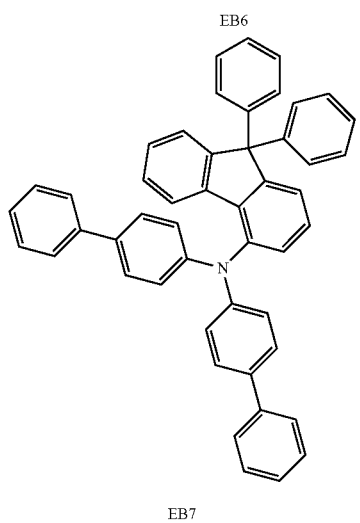

EB7

In the case of the electron blocking layer, the stability of the (+) radical is a factor affecting the life time. That is, when the life time is predicted in consideration of oxidation stability, the life time can be predicted more accurately.

FIG. 31 is a graph predicting the life time of the device in consideration of the calculated HOMO absolute values of Compounds EB1 to EB7 and the reversibility (oxidation stability=oxidation $I_r/I_f$ in 100 mV/s) within an oxidation range.

[FIG. 31]

$R2=0.9363$ life time=f(HOMO, oxidation stability)=360+(oxidation stability)−84.1×HOMO In FIG. 31, the respective points indicate the oxidation stability and the actual life time of Compounds EB1 to EB7, and the solid line is the prediction of the life time according to the HOMO and oxidation stability.

Referring to FIG. 31, it can be seen that predicting the life time in consideration of oxidation stability is approaching the actual life time value.

Through the Examples, it could be seen that a material capable of being used for the organic light emitting device could be selected by comparing the properties of the compounds through CV. It could be seen that when the material obtained by the aforementioned selection method is used for the organic light emitting device, the device has long life time characteristics.

Furthermore, it can be seen that the life time can be predicted based on the properties of the compounds obtained through the CV as described above.

The invention claimed is:

1. A method for selecting a material for an organic light emitting device, the method comprising:
 (S1) obtaining cyclic voltammograms of two or more samples, respectively within an oxidation range or reduction range at one to three scan rates using cyclic voltammetry (CV), wherein the scan rate is 1 to 3 of 10 mV/s, 50 mV/s, 100 mV/s, 300 mV/s, and 500 mV/s, respectively;
 (S2) comparing reversibilities of the samples by using the cyclic voltammogram and classifying the samples into <Group 1> or <Group 2>; and
 (S3) selecting a material for a light emitting layer, a hole transport layer, an electron blocking layer, an electron transport layer, or a hole blocking layer of an organic light emitting device based on the comparison of the reversibilities,
 wherein in the classifying of the sample of (S2), <Group 1> or <Group 2> are defined as follows:
 <Group 1> Samples (1) having forward and inverse peaks at all scan rates and no impurity peaks at all scan rates or (2) having forward and inverse peaks at all scan rates and impurity peaks at one or more scan rates; and
 <Group 2> Samples having no inverse peaks at one or more scan rates;
 wherein in the comparing of the reversibilities of the samples of (S2):
 the samples in <Group 1> are classified as more stable than those in <Group 2>,
 among samples having no impurity peak in <Group 1>, samples having high reversibility at the same scan rate are classified as stable,
 among samples having no impurity peak and samples having impurity peaks in <Group 1>, samples having high reversibility at the same scan rate are classified as stable,
 among samples having impurity peaks in <Group 1>, samples having high reversibility at the same scan rate or a smaller height ($I_i$) of the impurity peak than a height ($I_f$) of the forward peak are classified as stable,
 provided that when there is a sample having neither inverse peak nor forward peaks present at one or more scan rates, samples are compared at rates other than the rate at which neither inverse peaks nor forward peaks are present, and
 among samples belonging to <Group 2>, samples having the smaller maximum rate at which inverse peaks are not present are classified as stable,
 the reversibility is calculated by the following Equation 1:

Reversibility=$I_r/I_f$  <Equation 1> wherein in Equation 1, $I_r$ means the height of the inverse peak, and $I_f$ means the height of the forward peak,
wherein:
 a material having a highest occupied molecular orbital (HOMO) absolute value of 4.30 eV to 4.60 eV, and a reversibility value (Ir/If) of 0.83 or higher within an oxidation range at a scan rate of 100 mV/s at the time of measuring cyclic voltage current is suitable as a material for a hole transport layer;

a material having a reversibility value (Ir/If) of more than 0.5 within an oxidation range at a scan rate of 100 mV/s at the time of measuring cyclic voltage current is suitable as a material for an electron blocking layer;

a material having a lowest unoccupied molecular orbital (LUMO) absolute value of 2.40 eV to 2.74 eV, and a reversibility value (Ir/If) larger than [−23.14+8.458×(the LUMO absolute value)] within a reduction range at a scan rate of 100 mV/s at the time of measuring cyclic voltage current is suitable as a dopant material for a blue light emitting layer;

a material having a LUMO absolute value of 2.60 eV to 2.90 eV, and a reversibility value (Ir/If) larger than [4.96-1.535×(the LUMO absolute value)] within a reduction range at a scan rate of 100 mV/s at the time of measuring cyclic voltage current can be used is suitable as a material for an electron transport layer;

a material having both a forward peak and an inverse peak at a scan rate of 100 mV/s at the time of measuring cyclic voltage current within an oxidation range is suitable as a material for a hole blocking layer;

a material having a reversibility value (Ir/If) of [1.34×(the dipole moment)−0.293] or higher within an oxidation range at a scan rate of 500 mV/s and a reversibility value (Ir/If) of 0.95 or higher within a reduction range at a scan rate of 10 mV/s, at the time of measuring cyclic voltage current is suitable as a host material for a blue light emitting layer; and a material having a reversibility value (Ir/If) of [0.955−0.1786×(a stability value (Ir/If) within an oxidation range)] or higher within a reduction range at a scan rate of 10 mV/s, at the time of measuring cyclic voltage current is suitable as a host material for a light emitting layer.

2. The method of claim 1, wherein in Step (S1), a cyclic voltammogram is obtained by dissolving the sample within the oxidation range or the reduction range in an organic solvent.

3. The method of claim 2, wherein the organic solvent is dimethylformamide (DMF).

* * * * *